(12) United States Patent
Kawai et al.

(10) Patent No.: US 6,560,164 B2
(45) Date of Patent: May 6, 2003

(54) SEMICONDUCTOR INTEGRATED CIRCUIT DEVICE WITH INTERNAL CLOCK GENERATING CIRCUIT

(75) Inventors: Shinji Kawai, Hyogo (JP); Masaaki Mihara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/977,275

(22) Filed: Oct. 16, 2001

(65) Prior Publication Data

US 2002/0126565 A1 Sep. 12, 2002

(30) Foreign Application Priority Data

Jan. 23, 2001 (JP) ........................................ 2001-014106

(51) Int. Cl.[7] ................................................. G11C 8/00
(52) U.S. Cl. ..................................................... 365/233
(58) Field of Search ................................. 365/211, 233, 365/189.07, 189.09, 189.11

(56) References Cited

U.S. PATENT DOCUMENTS

| 5,440,520 | A | * | 8/1995 | Schutz et al. | ................ | 365/211 |
| 5,498,971 | A | * | 3/1996 | Turnbull et al. | ............ | 365/211 |
| 5,784,328 | A | * | 7/1998 | Irrinki et al. | ................ | 365/211 |
| 5,903,506 | A | * | 5/1999 | Blodgett | ...................... | 365/211 |

FOREIGN PATENT DOCUMENTS

| JP | 60-103425 | 6/1985 |
| JP | 5-189077 | 7/1993 |
| JP | 5-224772 | 9/1993 |

* cited by examiner

*Primary Examiner*—Trong Phan
(74) *Attorney, Agent, or Firm*—McDermott, Will & Emery

(57) ABSTRACT

A temperature dependency of an internal clock signal generated by an internal clock generating circuit is effectively reduced. A temperature detecting circuit is provided to a variable clock generator for generating the internal clock signal and an oscillating cycle period of the variable clock generator is altered according to a detection signal of the temperature detecting circuit. A cycle of the internal clock signal is altered and a temperature dependency of the internal clock signal is effectively compensated for.

16 Claims, 16 Drawing Sheets

SEMICONDUCTOR INTEGRATED CIRCUIT DEVICE WITH INTERNAL CLOCK GENERATING CIRCUIT

BACKGROUND OF THE INVENTION

1. Field of the Invention

The present invention relates to a semiconductor integrated circuit device, and particularly to a semiconductor memory device with an internal clock generating circuit embedded therein. More particularly, the present invention relates to a configuration of a clock generating circuit for generating a clock signal used for producing an internal voltage or for determining an internal timing in a non-volatile memory such as a flash EEPROM (electrically erasable and programmable read only memory).

2. Description of the Background Art

FIG. 23 is a diagram schematically showing an overall configuration of a flash EEPROM as an example of a conventional semiconductor integrated circuit device. Referring to FIG. 23, the semiconductor integrated circuit device includes: a memory array 900 having a plurality of non-volatile memory cells arranged in rows and columns; an X decoder 901 for selecting an addressed row in the memory array 900; a Y decoder 902 for selecting an addressed column in the memory array 900; and a source/well decoder 903 for selecting a source line and a well (substrate) region in the memory array 900. In a data write (program)/erasure operation of a non-volatile memory cell, a voltage for write (program) or erasure is applied on a source, a gate and a substrate region of a selected non-volatile memory cell. The source/well decoder 903 selects a source line and a well region onto which the voltages necessary for the write (program: simply referred to write hereinafter)/erasure are applied.

The semiconductor integrated circuit device further includes: an address buffer 904 receiving an external address signal to generate an internal address signal based on the received external address signal depending on an operating mode; a write circuit/sense amplifier 905 for performing write/read of data; and a data buffer 906 for performing external input/output of data.

The address buffer 904, in a normal data read mode, generates an internal address signal according to external address input to generate an internal address signal to the X decoder 901, the Y decoder 902, and the source/well decoder 903. In a write/erase mode, the address buffer 904 selects address signals sequentially generated internally according to an external address to apply the selected address signals to the decoders 901 to 903.

The write circuit/sense amplifier 905 includes: a write register circuit for sequentially storing write data received from a data input buffer included in the data buffer 906 in data write operation mode; and an external read sense amplifier for amplifying memory cell data read out from memory cells selected by the Y decoder 902 to apply the amplified data to a data output circuit included in the data buffer 906 in data read operation mode. The write circuit/sense amplifier 905 may include an internal read sense amplifier for internally reading out data for verification of write/erasure.

The semiconductor integrated circuit further includes: a write/erase control circuit 909 capturing an external command to generate internal control signals necessary in a specified operating mode under control of a control signal; a high voltage generating circuit 908 for generating a high voltage (a positive or negative high voltage) necessary in write/erase operation under control of the write/erase control circuit 909; and a ring oscillator circuit 907 performing an oscillating operation under control of the write/erase control circuit 909 to generate a clock signal providing an operation timing for the write/erase control circuit 909 and being used in a high voltage generating operation of the high voltage generating circuit 908.

The write/erase control circuit 909 determines whether an effective (valid) command is applied according to a specific control signal, such as a write enable signal /WE, to generate necessary control signals according to an operating mode specified by the effective command, for controlling the operations of the decoders 901 to 903, the address buffer 904, the write circuit/sense amplifier 905 and the data buffer 906.

The address buffer 904 takes in an external address when an external control signal instructs that the semiconductor integrated circuit device is selected. The data buffer 906 also performs buffering of data read out by the write circuit/sense amplifier 905 to output the buffered data externally when the external control signal instructs data read.

In the semiconductor integrated circuit shown in FIG. 23, the ring oscillator circuit 907 performs an oscillating operation in a predetermined oscillating period to generate a master clock signal providing an operating timing of the write/erase control circuit 909 and further generates a pump clock signal necessary for a charge pump operation of the high voltage generating circuit 908 normally constituted of a charge pump circuit. Hence, in the ring oscillator circuit 907, there are individually provided a circuit for generating a master clock signal and a circuit for generating a charge pumping clock signal.

With such ring oscillator circuit 907 provided internally, the number of pin terminals decreases and there is no need to drive an on-board interconnection line for transmitting an external clock signal, when compared with a configuration to which the external clock signal is applied, and the power consumption of the entire system is reduced. By operating the write/erasure control circuit 909 in synchronization with the master clock signal from the ring oscillator circuit 907, various kinds of internal operation timings can be determined on the basis of the master clock signal, thereby enabling accurate setting of the internal timings.

FIG. 24 is a diagram representing an example of the configuration of a ring oscillator included in the ring oscillator circuit 907 shown in FIG. 23. In FIG. 24, the ring oscillator circuit 907 includes: inverter chain including cascaded inverters IVa of (2n−1) stages; and an inverter IVb inverting an output signal from the last stage of the inverter chain to generate an output signal φOUT (clock signal).

The ring oscillator is constituted of the inverter chain including inverters IVa of an odd number of cascaded stages. In a case where an oscillating circuit is constituted of such inverter chain, a CMOS inverter formed of a P channel MOS transistor (an insulated gate field effect transistors) and an N channel MOS transistor is generally employed as each inverter IVa of the inverter chain and the inverter IVb.

In such a CMOS inverter, an operating characteristic of a MOS transistor has a temperature dependency. That is, in a MOS transistor, as temperature rises, each mobility of electrons and holes in a channel is made smaller (due to increased lattice vibration and/or lattice scattering), and thereby, a drain current Ids decreases. Hence, the operating characteristics of the CMOS inverter chain has such a temperature dependency that, charging and discharging speeds become faster as temperature falls and an oscillating period of the ring oscillator become shorter, while as temperature rises, the charging and discharging speeds of the inverter chain formed of inverters IVa becomes slower and an oscillating period thereof becomes longer.

FIG. 25 is a diagram representing an example of the configuration of the high voltage generating circuit 908 shown in FIG. 23. In FIG. 25, the high voltage generating circuit 908 includes a charge pump 908a for generating a high voltage VP according to an output signal φOUT of a ring oscillator 907a included in the ring oscillator circuit 907. The charge pump 908a utilizes a capacitor to perform a charge pump operation according to the output signal φOUT of the ring oscillator 907a for generating the high voltage VP. The high voltage generated by the high voltage generating circuit 908 may be a negative voltage. Even in a case of a high voltage of the negative polarity, a negative high voltage is generated through a charge pump operation. Now, it is assumed that the high voltage VP is a positive voltage.

In the charge pump 908a, an amount of electric charges transferred by a one time pump operation is proportional to a product of a capacitance value of the capacitor used in the charge pump 908a and a frequency of the output signal φOUT of the ring oscillator 907a. Therefore, when an oscillating cycle period becomes longer and a frequency of the pumping clock signal φOUT becomes lower, a pumping capability of the charge pump 908a decreases, thereby disabling setting of the high voltage VP to an intended voltage level.

Conversely, as temperature decreases, the oscillating period of the ring oscillator 907a becomes shorter, a frequency of the output signal φOUT thereof becomes higher, a pumping capability of the charge pump 908a becomes higher and power is unnecessarily consumed to increase the power consumption.

That is, a positive high voltage VP or a negative high voltage VB generated by the high voltage generating circuit 908 comes to have temperature dependency as shown in FIG. 26. That is, the positive high voltage VP has a negative temperature dependency, while the negative high voltage VB has a positive temperature dependency. In general, operating conditions are set, based on the premise that the positive and negative high voltages VP and VB satisfy the respective design values VPR and VBR.

In a non-volatile memory, a memory cell is constituted of a stacked gate MOS transistor having a control gate and a floating gate. Write and erasure are achieved by shifting a threshold voltage of the memory cell transistor through injection/ejection of electric charges into/from the floating gate. While a write and erasure states of a memory cell are different depending on a memory cell configuration, the high voltages VP and/or VB are applied to a prescribed region of a memory cell transistor such that migration of electrons arises to or from the floating gate in the write/erasure operation. In a case where the absolute values of the high voltages VP and VB are smaller than prescribed values VPR and |VBR|, respectively, migration of a sufficient amount of electric charges does not occur, and therefore, no correct write/erasure can be performed. In general, a verification operation is performed in the write/erasure and there is an opportunity where such erroneous determination is made that the write/erasure is incomplete.

In a case where temperature is low, the high voltages VP and VB could be normally set so as to assume respective prescribed values by a level detecting circuit. Therefore, a problem of such defective write/erasure may hardly occur. However, since the charge pump circuit 908a comes to have an increased pumping capability, a current more than necessity is consumed, resulting in a problem of an increase in consumed current.

Furthermore, in a case where an output signal of the ring oscillator in the ring oscillator circuit 907 is used as a master clock for the write/erasure control circuit 909, a frequency of the master clock signal has a temperature dependency, an internal operation timing varies depending on temperature, and a timing margin of an internal operation varies over a wide operating temperature range. Therefore, a problem arises that a stable operation cannot be ensured Accordingly, in a case where a ring oscillator circuit is provided in the semiconductor memory device and a clock signal is generated internally, to perform generation of a necessary internal voltage and determination of an internal timing, there arises a problem that a stable clock signal can not be supplied over a wide range of an operating temperature of the semiconductor memory device.

In general, a ring oscillator circuit having a temperature detection function of performing temperature compensation for eliminating such a temperature dependency is provided separately on a system board and a clock signal is supplied from the outside of the semiconductor memory device, resulting in a problem of increase in number of terminals and chip area of the semiconductor memory device. Furthermore, in a case where a clock signal is generated by an external ring oscillator circuit on a system board, an on-board wire is necessary to be driven, leading to a problem that a consumed current as a whole increases. Thus, such a problem arises that an advantage of a semiconductor memory device with an internal clock generating clock is lost, and a mounting area of the entire system is also increased.

SUMMARY OF THE INVENTION

It is an object of the present invention to provide a semiconductor integrated circuit device having an internal clock generating circuit capable of stably supplying a clock signal over a wide range of operating temperature.

It is another object of the present invention to provide a clock generating circuit suited for integration and capable of stably generating a clock signal over a wide range of operating temperature.

It is still another object of the present invention to provide an internal clock generating circuit capable of stably supplying a clock signal used in a non-volatile memory.

A semiconductor integrated circuit device according to the present invention includes: a memory circuit for storing data; a clock generating circuit for generating a clock signal used by the memory circuit; a temperature detecting circuit; and a cycle change circuit for changing a cycle of a clock signal generated by the clock generating circuit according to a detection output signal of the temperature detecting circuit.

A semiconductor integrated circuit device according to another aspect of the present invention includes: a memory circuit for storing data; a temperature detecting circuit, integrated together with the memory circuit on a common semiconductor substrate, for detecting temperature; and a clock generating circuit, integrated together with the memory circuit on the common semiconductor substrate, for generating a clock signal having a cycle thereof changed according to an output signal of the temperature detecting circuit. The clock signal is used in the memory circuit.

By providing an on-chip temperature detecting function for performing temperature compensation on a clock signal, there is no necessity to provide a temperature detecting circuit on a board, thereby enabling a system mounting area on the board to decrease.

Since temperature detection and clock generation are performed in the inside of a semiconductor integrated circuit device, power consumption of the entire system can be reduced and furthermore, there is no necessity to provide an extra terminal for temperature detection or for a clock signal input to a semiconductor integrated circuit, thereby allowing a chip area to decrease.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Overall Configuration

Figure 1:
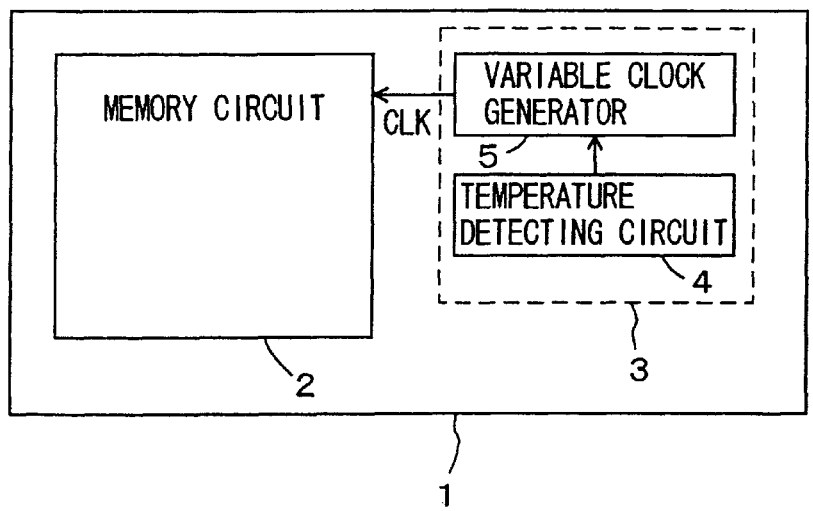
FIG. 1 is a diagram schematically showing an overall configuration of a semiconductor integrated circuit device according to the present invention.

FIG. 1 is a diagram schematically showing an overall configuration of a semiconductor integrated circuit according to the present invention. In FIG. 1, a semiconductor integrated circuit device 1 includes: a memory circuit 2 for storing data; and a clock generator 3 with a temperature compensating function for generating a clock signal CLK used by the memory cell circuit 2.

Figure 23:
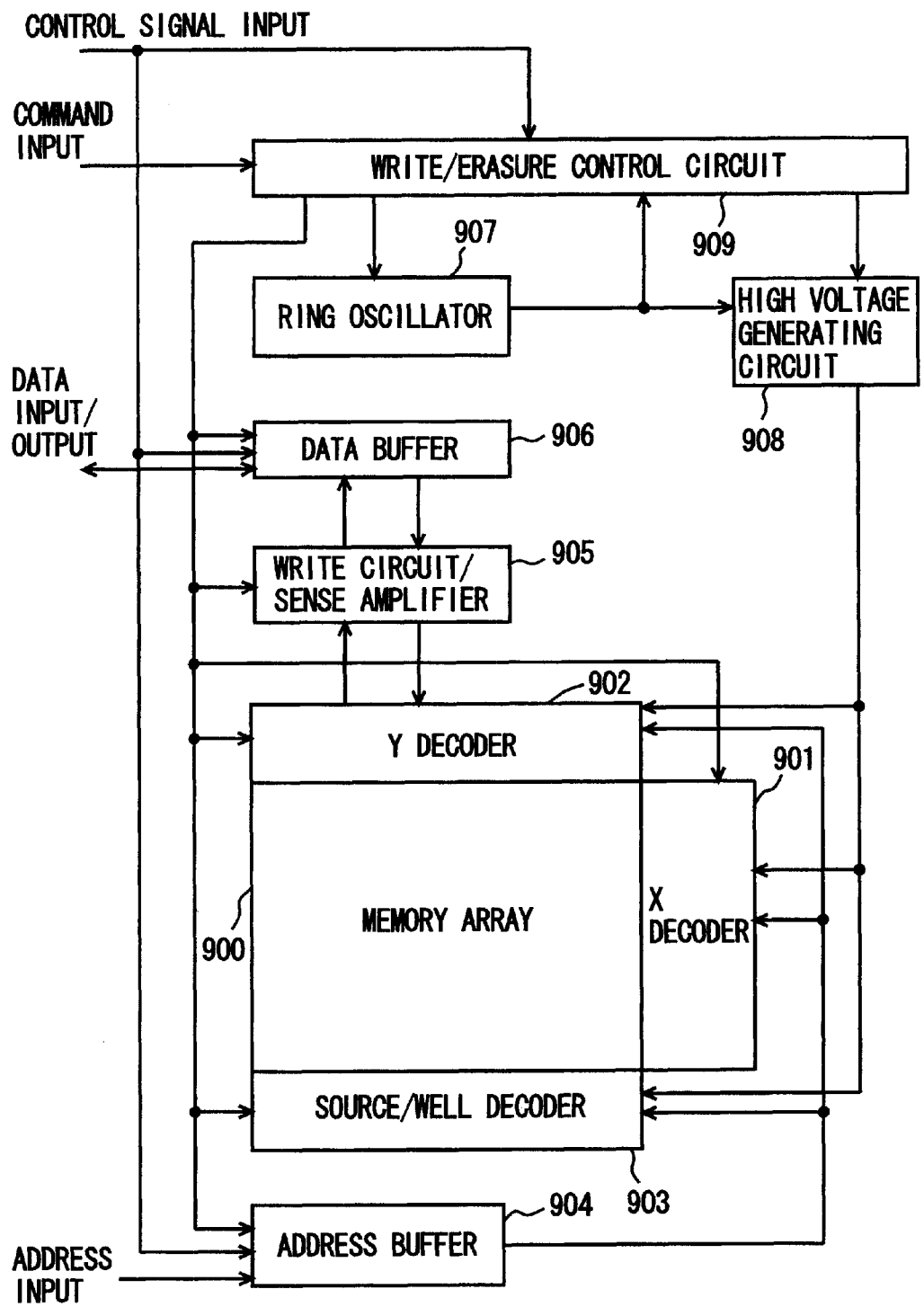
FIG. 23 is a diagram schematically showing an overall configuration of a conventional semiconductor memory device.
Figure 24:
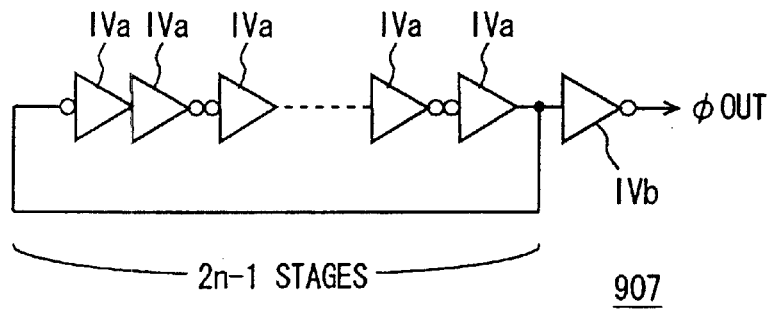
FIG. 24 is a diagram representing an example of the configuration of a ring oscillator circuit shown in FIG. 23.
Figure 25:
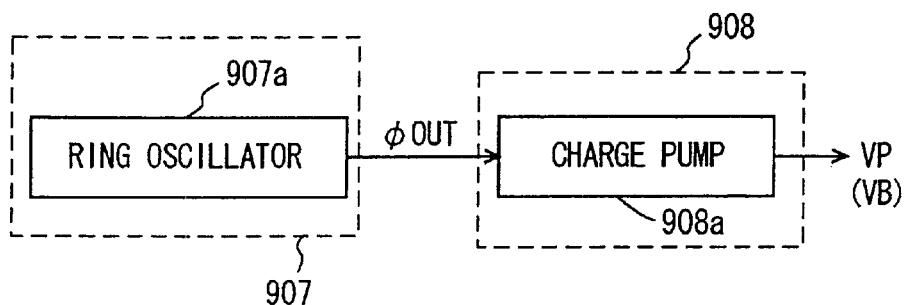
FIG. 25 is a diagram schematically showing a configuration of a high voltage generating circuit shown in FIG. 23.
Figure 26:
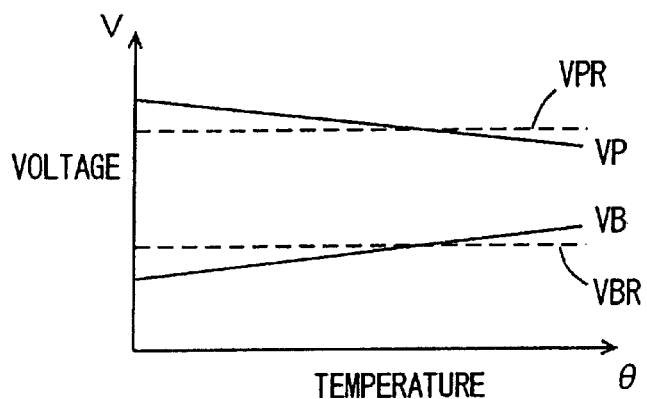
FIG. 26 is a graph schematically showing temperature dependencies of output voltages of a charge pump shown in FIG. 25.

The memory circuit 2 includes a circuit portion other than a ring oscillator circuit 907 among the components of the semiconductor memory device previously shown in FIG. 23, and has an operating timing thereof determined according to a clock signal CLK from the clock generator with a temperature compensating function 3, and also generates necessary internal high voltages according to the clock signal CLK.

The clock generator with a temperature compensating function 3 includes: a temperature detecting circuit 4 detecting an operating temperature in the semiconductor integrated circuit 1; and a variable clock generator 5 whose oscillating cycle period is varied according to a detection signal of the temperature detecting circuit 4.

Figure 2:
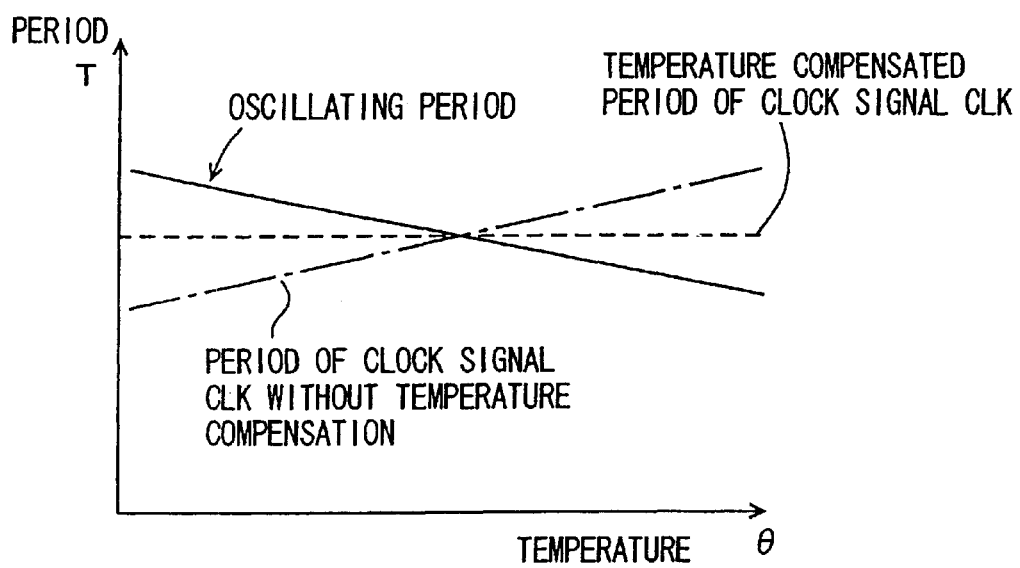
FIG. 2 is a graph conceptually showing a temperature characteristic of an internal clock in the present invention.

As shown in FIG. 2, the variable clock generator 5 has an oscillation cycle period made shorter, as temperature detected by the temperature detecting circuit 4 rises, to compensate for increase in the oscillating cycle period caused due to the temperature rise, for generating the internal clock signal CLK of a constant oscillating cycle period.

Referring to FIG. 2, as the operating temperature e rises, an oscillating cycle period of the variable clock generator 5 is made shorter according to a temperature detecting signal of the temperature detecting circuit 4. As the operating temperature e falls, the oscillating cycle period T of the variable clock oscillator 5 becomes longer. Therefore, by shortening the oscillating cycle period T of the variable clock generator 5 according to the temperature rise, a temperature dependency of a cycle period of the clock signal CLK is compensated for, thereby enabling generation of the internal clock signal CLK with substantially constant cycle period.

With such a temperature compensation on a cycle period of the clock signal adopted, the memory circuit 2 operates at a correct timing and further, an internal high voltage at intended voltage level can be stably generated, thereby enabling the memory circuit 2 to operate in a stable manner.

First Embodiment

Figure 3:
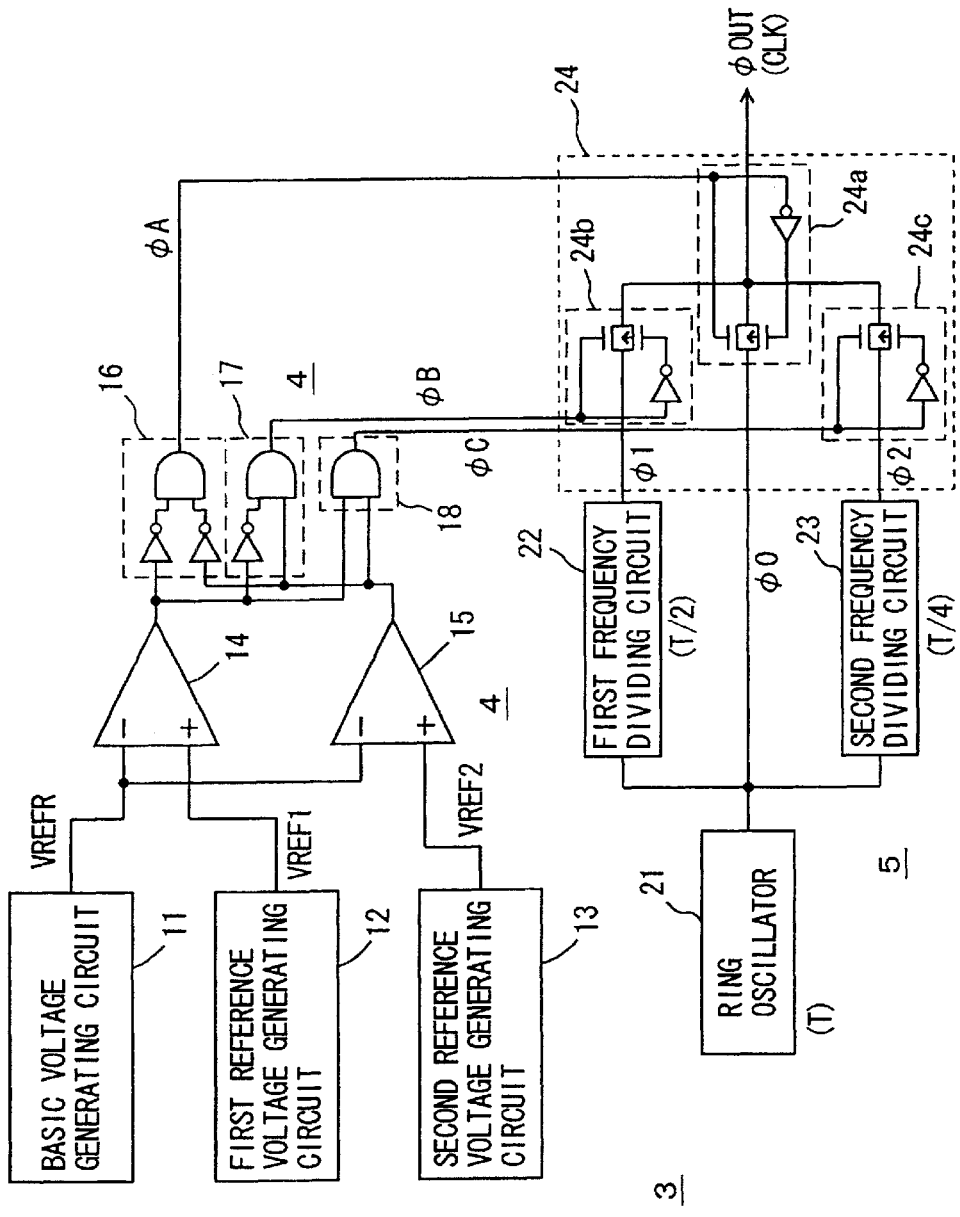
FIG. 3 is a diagram representing a configuration of a clock generator with a temperature compensating function according to a first embodiment of the present invention.

FIG. 3 is a diagram representing a configuration of a clock generator 3 with a temperature compensating function 3 according to a first embodiment of the present invention. Referring to FIG. 3, the temperature detecting circuit 4 includes: a basic voltage generating circuit 11 for generating a basic voltage VREFR at a constant voltage level not depending on temperature; a first reference voltage generating circuit 12 for generating a first reference voltage VREF1 depending on temperature; a second reference voltage generating circuit 13 for generating a second reference voltage VREF2 different in voltage level from the first reference voltage VREF1 and having a temperature dependency; a comparing circuit 14 for comparing the basic voltage VREFR with the first reference voltage VREF1; a comparing circuit 15 for comparing the basic voltage VREFR with the second reference voltage VREF2; and gate circuits 16 to 18 for generating temperature detection signals φA to φC according to output signals of the comparing circuits 14 and 15.

The comparing circuit 14 outputs an H level signal when a level of the first reference voltage VREF1 is equal to or higher than the basic voltage VREFR. The comparing circuit 15 outputs an H level signal when the second reference voltage VREF2 is equal to or higher than the basic voltage VREFR.

The gate circuit 16 drives its output signal φA to H level when output signals of the comparing circuits 14 and 15 are both at L level. The gate circuit 17 drives its output signal φB to H level when an output signal of the comparing circuit 14 is at L level and an output signal of the comparing circuit 15 is at H level. The gate circuit 18 drives its output signal φC to H level when outputs signals of the comparing circuits 14 and 15 both go to H level. The output signals φA, φB and φC, in combination, act as a temperature detection signal and specify an operating temperature range.

The variable clock generating circuit 5 includes: a ring oscillator 21 oscillating at a cycle period T to generate an oscillating signal φ0; a first frequency dividing circuit 22 for frequency dividing the oscillating signal φ0 outputted by the ring oscillator 21 to generate a frequency divided signal φ1; a second frequency dividing circuit 23 for frequency dividing the output signal φ0 of the ring oscillator 21 to generate a frequency divided signal φ2; and a clock select circuit 24 for selecting one of the signals φ0 to φ2 according to the temperature detection signals φA to φC to generate an output clock signal φOUT (CLK).

The first and second frequency dividing circuits 22 and 23 have different division ratios. For example, the first frequency dividing circuit 22 performs a ½ frequency division to generate a frequency divided signal φ1 with an oscillating cycle period T/2, and the second frequency dividing circuit 23 performs a ¼ frequency division to generate a frequency divided signal φ2 with an oscillating cycle period T/4. Therefore, the frequency dividing circuits 22 and 23 each are a frequency multiplier and the signals φ1 and φ2 have frequencies twice and four times as high as that of the signal φ0 outputted by the ring oscillator 21, respectively.

The clock select circuit 24 includes: a selector 24a rendered conductive to select the output signal φ0 of the ring oscillator 21 for generating the clock signal φOUT (CLK) when the temperature detection signal φA is activated; a selector 24b rendered conductive to select the frequency divided signal φ1 from the ring oscillator 22 for generating the clock signal φOUT (CLK) when the temperature detection signal φB is activated; and a selector 24c rendered conductive to select the frequency divided signal φ2 of the ring oscillator 23 for generating the clock signal φOUT (CLK) when the temperature detection signal φC is activated.

The selectors 24a to 24b each includes: an inverter for inverting a corresponding temperature detection signal; and a CMOS transmission gate rendered conductive according to complementary signals of a corresponding temperature detection signal. Hence, the selectors 24a to 24c each are in an output high impedance state when made inactive, to prohibit transmission to a clock output node of corresponding signals φ0 to φ2.

Figure 4:
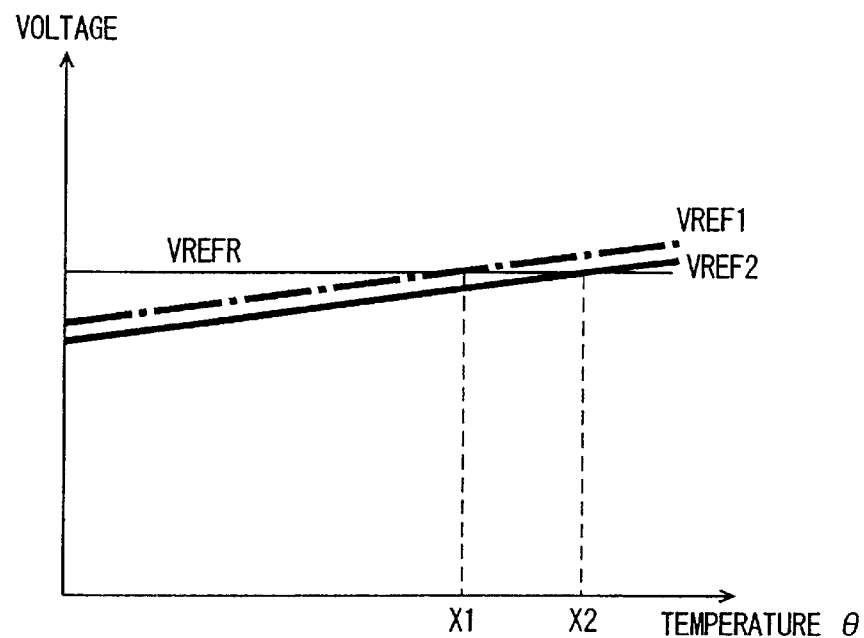
FIG. 4 is a graph showing temperature dependencies of reference voltages and a basic voltage shown in FIG. 3.

FIG. 4 is a graph showing temperature dependencies of the reference voltages VREF1 VREF2 and the basic voltage VREFR shown in FIG. 3. In FIG. 4, the basic voltage VREFR is at a constant voltage level not depending on temperature. The reference voltages VREF1 and VREF2 each have a positive temperature coefficient and increase in the voltage level as temperature Θ rises. The reference voltage VREF1 is set to a higher voltage level than that of the reference voltage VREF2. The reference voltage VREF1 attains a higher voltage level than that of the basic voltage VREFR when the temperature Θ rises to or beyond temperature X1. The second reference voltage VREF2 attains a voltage level equal to or higher than that of the basic voltage VREFR when the temperature Θ rises to or beyond temperature X2.

Figure 5:
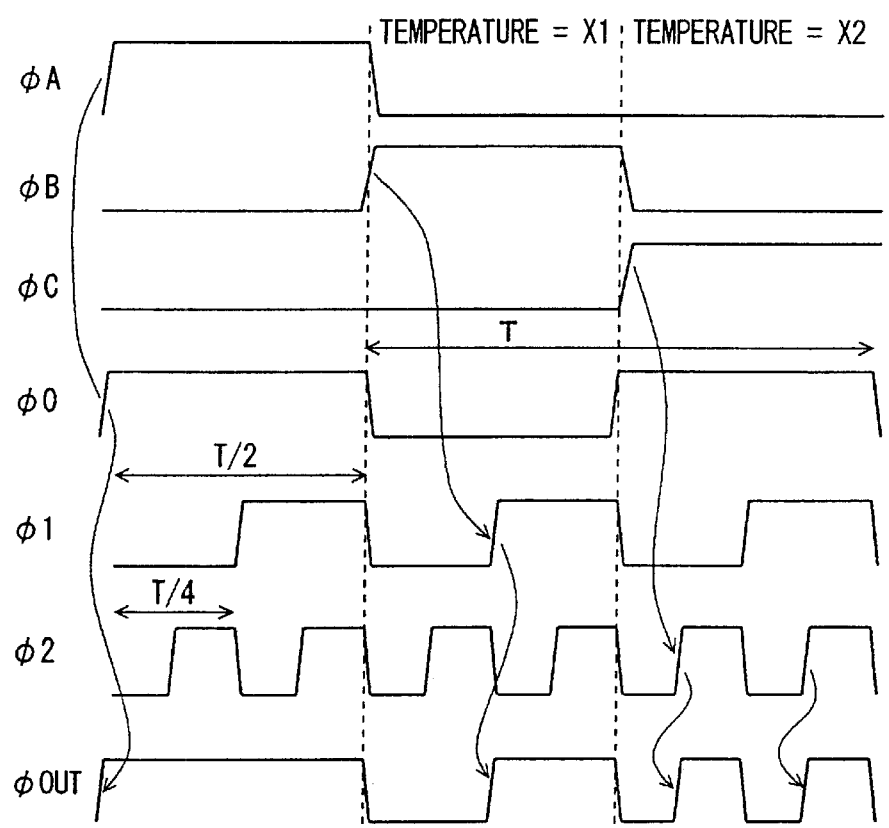
FIG. 5 is a signal waveform diagram representing operation of the circuit shown in FIG. 3.

When the temperature Θ is lower than the temperature X1, the comparing circuits 14 and 15 both output L level signals. Therefore, the temperature detection signal φA from the gate circuit 16 attains H level, while the temperature detection signals φB and φC outputted by the gate circuits 17 and 18 are at L level. Hence, the selector 24a shown in FIG. 3 is rendered conductive to select the output signal 40 of the ring oscillator 21. Accordingly in a temperature range equal to or lower than the temperature X1, as shown in FIG. 5, the oscillating signal φ0 changing at a cycle period T is selected and outputted as the output clock signal φOUT.

When the temperature Θ goes to or higher than the temperature X1 but is lower than the temperature X2, an output signal of the comparing circuit 14 is at H level and an output signal of the comparing circuit 15 is L level. Hence, in this state, the output signal φB of the gate circuit 17 goes to H level and output signals of the gate circuits 16 and 18 both go to L level. Therefore, the selector 24b shown in FIG. 3 is rendered conductive to select the frequency divided signal φ1 with a cycle period T/2 outputted by the first frequency dividing circuit 22 and output the frequency divided signal φ1 as the output clock signal OUT.

When the temperature Θ rises at least to the temperature X2, outputs of the comparing circuits 14 and 15 both attain H level, the temperature detection signal φC outputted by the gate circuit 18 attains H level and the temperature detection signals φA and φB outputted by the gate circuits 16 and 17 both attain L level. Thus, in the clock select circuit 24, the selector 24c is rendered conductive to select the frequency divided signal φ2 outputted by the second frequency dividing circuit 23 and output the selected frequency divided signal as the output clock signal φOUT. In this temperature range, the clock signal OUT has, therefore, a cycle of T/4.

As described above, as the temperature rises, an oscillating cycle period of the output clock signal φOUT used as the clock signal CLK becomes shorter. On the other hand, as the temperature falls, operating speeds of the ring oscillator 21 and the frequency dividing circuits 22 and 23 become slower. With no temperature compensation, an oscillating cycle period of the ring oscillator 21 has a positive temperature dependency; so that as the temperature rises, the cycle period is made longer. The frequency dividing circuits 22 and 23 each are generally constructed of a flip flop chain and its output signal changes according a change of a received signal. Therefore, no change arises in frequency division operation itself generating each of frequency divided signals having cycle period ½ times and ¼ times as long as that of an oscillating cycle period of the ring oscillator 21.

In the ring oscillator 21, as the temperature rises, its oscillating cycle period becomes longer because of its positive temperature dependency. An oscillating cycle period of the clock signal actually applied to a memory circuit is decreased as temperature rises, so that the output clock signal (clock signal CLK) φOUT having a constant cycle not depending on temperature can be generated to be applied to the memory circuit.

In FIG. 5, in order to conceptually represent the select operation, the output clock signal φOUT is shown becoming shorter and shorter as the temperature rise. However, an oscillating cycle period becomes longer as the temperature rises and temperature compensation is performed to reduce the oscillating cycle period, so that a cycle period of the output clock signal φOUT becomes constant.

As described above, an oscillating cycle period of the clock signal changes stepwise over a plurality of levels to correctly compensate for the cycle period of the clock signal according to an operating temperature, thereby enabling generation of the internal clock having a constant cycle period.

Figure 6:
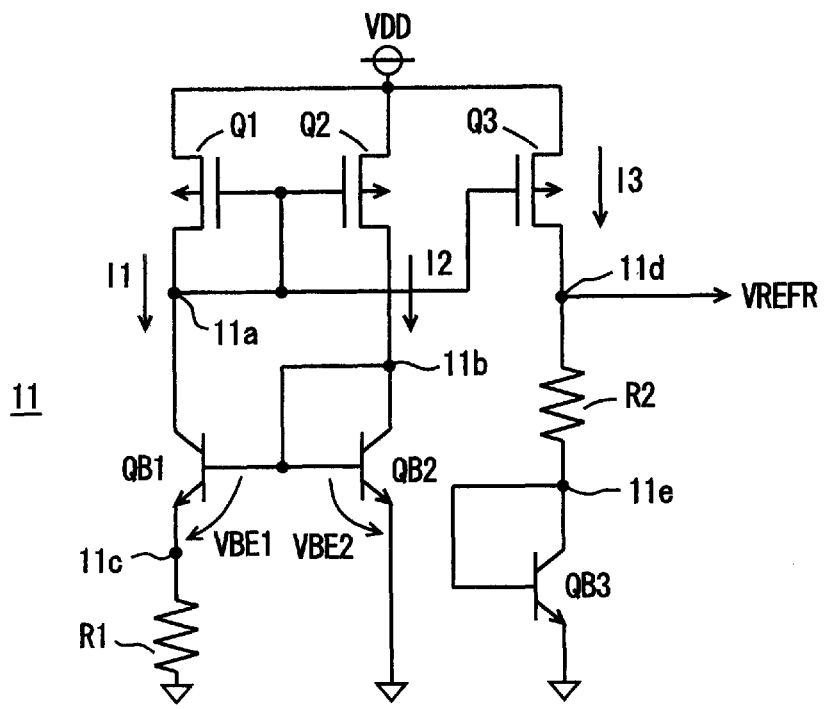
FIG. 6 is a diagram representing an example of the configuration of a basic voltage generating circuit shown in FIG. 3.

FIG. 6 is a diagram representing an example of the configuration of the basic voltage generating circuit 11 shown in FIG. 3. In FIG. 6, the basic voltage generating circuit 11 includes: a P channel MOS transistor Q1, connected between a power supply node and a node 11a, having a gate connected to a node 11a; a P channel MOS transistor Q2, connected between the power supply and the node 11a, having a gate connected to the node 11a; an NPN bipolar transistor QB1, connected between the node 11a and a node 11c, having a base connected to the node 11b; a resistance element R1 connected between the node 11c and a ground node; an NPN bipolar transistor QB2, connected between the node 11b and the ground node, having a base connected to the node 11b; a P channel MOS transistor Q3, connected between the power supply node and the output node 11d, having a gate connected to the node 11a; and an NPN bipolar transistor QB3, connected between the node 11d and a node 11e, having a base connected to the node 11e.

In the basic voltage generating circuit 11, currents I1 and I2 represented by the following expressions flow through the bipolar transistors QB1 and QB2:

$$I1 = A1 \cdot \exp(VBE1/Vt) \qquad (1)$$

$$I2 = A2 \cdot \exp(VBE2/Vt) \qquad (2)$$

$$Vt = k \cdot \Theta/q \qquad (3),$$

where A1 and A2 indicate emitter areas of the bipolar transistors QB1 and QB2, respectively, VBE1 and VBE2 indicate bandgap voltages (base to emitter junction voltage) of the bipolar transistors QB1 and QB2, respectively, k is the Boltzmann constant and q indicates an electric charge.

The following relation (4) is derived from the above expressions (1) and (2).

$$VBE2 = VBE1 = VT \cdot \{1n(I2/A2) - (1n(I1/A1))\} \qquad (4)$$

The MOS transistors Q1 and Q2 constitute a current mirror circuit and when sizes (a ratio of a channel width to a channel length, W/L) of the MOS transistors Q1 and Q2 are equal to each other, the currents I1 and I2 are equal in magnitude to each other (I1=I2).

If an emitter area A1 of the bipolar transistor QB1 is N times as large as an emitter area A2 of the bipolar transistor QB2, the above relation (4) is rewritten in the following expression.

$$VBE2 - VBE1 = Vt \cdot 1n(N) \qquad (5)$$

Since the currents I1 and I2 are equal in amount to each other and a voltage of (VBE2−VBE1) is applied across the resistance element R1, the current I1 (=I2) is given by the following expression (6):

$$\begin{aligned} I1 = I2 &= (VBE2 - VBE1)/R1 \\ &= Vt \cdot 1n(N)/R1 \end{aligned} \qquad (6)$$

The MOS transistor Q3 and the MOS transistor Q1 constitute a current mirror circuit. Therefore, when a mirror ratio of a current I3 flowing through the MOS transistor Q3 is 1, the basic voltage VREFR is given by the following relation:

$$VREFR = I1 \cdot R2 + VBE3 = Vt \cdot 1n(N) \cdot (R2/R1) + VBE3 \qquad (7),$$

where resistance values of resistance elements R1 and R2 are indicated by R1 and R2. The resistance elements are made of the same material and if a ratio between resistance values thereof are expressed by R2/R1=M by definition, the following relation is derived.

$$VREFR = M \cdot VT \cdot 1n(N) + VBE3 \qquad (8),$$

where a coefficient Vt is a positive temperature coefficient and a temperature coefficient of a bandgap voltage VB3 is negative. The resistance ratio M is a constant with no temperature dependency. Thus, by adjusting the ratio M of the resistance elements R1 and R2, the basic voltage VREFR exhibits no temperature dependency, and the basic voltage VREFR can be kept at a constant value over a wide temperature range.

Figure 7:
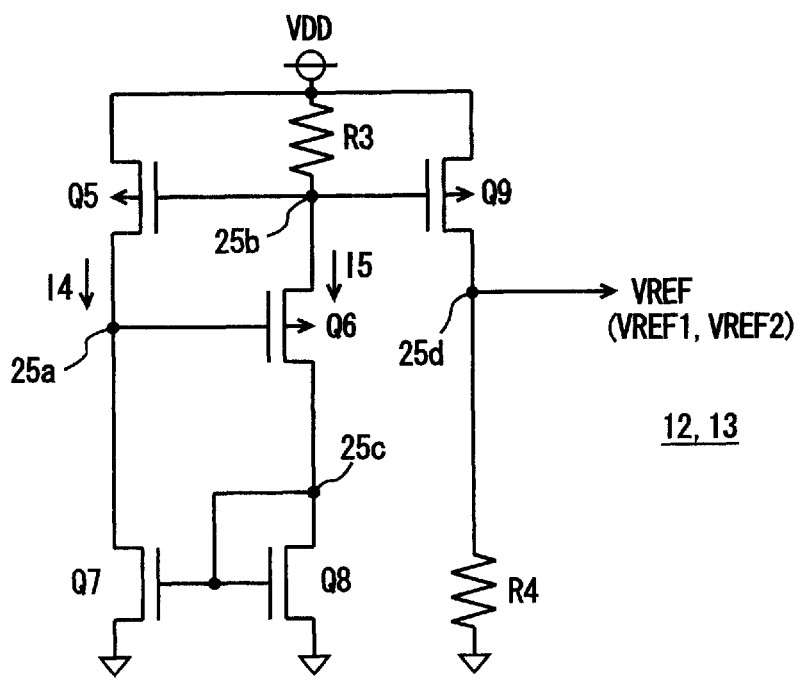
FIG. 7 is a diagram representing an example of the configuration of a reference voltage generating circuit shown in FIG. 3.

FIG. 7 is a diagram representing an example of the configuration of a reference voltage generating circuit 12 or 13 shown in FIG. 3. Since the reference voltage generating circuits 12 and 13 are both of the same configuration, one of them is shown in FIG. 7.

In FIG. 7, the basic voltage generating circuit (12 or 13) includes: a P channel MOS transistor Q5, connected between a power supply node and a node 25a, having a gate connected to a node 25b; a resistance element R3 connected between the power supply node and the node 25b; an N channel MOS transistor Q7, connected between the node 25a and a ground node, having a gate connected to a node 25c; a P channel MOS transistor Q6, connected between the nodes 25b and 25c, having a gate connected to the node 25a; an N channel MOS transistor Q8, connected between the node 25c and the ground node, having a gate connected to the node 25c; a P channel MOS transistor Q9, connected between the power supply node and an output node 25d, having a gate connected to the node 25d; and a resistance element R4 connected between the output node 25d and the ground node.

The MOS transistors Q7 and Q8 constitute a current mirror circuit and a current driving capability of each of the MOS transistors Q7 and Q8 is made sufficiently lower than that of the MOS transistor Q5.

In this arrangement, since a small current I4 flows through the MOS transistor Q5, a gate to source voltage of the MOS transistor Q5 becomes substantially equal to a threshold voltage Vthp. In the MOS transistor Q6, as a voltage level of the node 25a rises, a conductance decreases, a current I5 decreases to raise a voltage level at the node 25b, and a conductance of the MOS transistor Q5 is decreased to reduce the current I4 for lowering a voltage level at the node 25a. That is, by feed-back control of the MOS transistor Q6, a voltage level at the node 25b is held constant to stay at a voltage level of (VDD−|Vthp|).

The MOS transistors Q7 and Q8 constitute a current mirror circuit, and therefore, the currents I4 and I5 are equal in magnitude to each other, provided that sizes of the MOS transistors Q7 and Q8 are equal to each other. Accordingly, the currents I4 and I5 are given by the following expression.

$$I4 = I5 = |Vthp|/R3 \qquad (9)$$

If a threshold voltage of the MOS transistor Q9 is the same as a threshold voltage of the MOS transistor Q5, the reference voltage VREF(VREF1 or VREF2) is given by the following expression.

$$VREF = A3 \cdot |Vthp| \cdot R4/R3 \qquad (10),$$

where A3 indicates a size ratio (β ratio) of the MOS transistors Q9 and Q5, and R3 and R4 resistance values of the respective resistance elements R3 and R4.

When the resistance elements R3 and R4 are made from the same material, a ratio of resistance values R3 and R4 is a constant value not depending on temperature. The absolute value |Vthp| of a threshold voltage of a P channel MOS transistor has a positive coefficient and a value thereof increases with rise of temperature; therefore, the reference voltage VREF has a positive temperature dependency. By changing a ratio in resistance value between the resistance elements R3 and R4 or a size of the MOS transistor Q9 (β: a ratio of a channel width to a channel length), there can be generated the reference voltages VREF1 and VREF2 which are different from each other in voltage level and a temperature dependency.

Accordingly, by properly determining resistance values of the resistance elements R3 and R4, a size of the MOS transistor Q9 and a threshold voltage Vthp of the MOS transistor Q5, a desired temperature range can be detected.

In the above described embodiment, a temperature region is divided into three regions. However, the oscillating cycle period of the clock signal can be changed in a discrete manner over n levels in a similar manner to achieve finer control of temperature compensation, if there are provided n kinds of reference voltage generating circuits and n selectors for selecting an output clock signal.

According to the first embodiment of the present invention, as described above, an oscillating cycle period of the clock signal is switched over a plurality of levels according to the operating temperature. Therefore, an actual oscillating cycle period of the clock signal applied to the memory circuit can be held constant over a wide operating temperature range through temperature compensation on the clock cycle period, thereby enabling supply of a stable clock signal.

Second Embodiment

Figure 8:
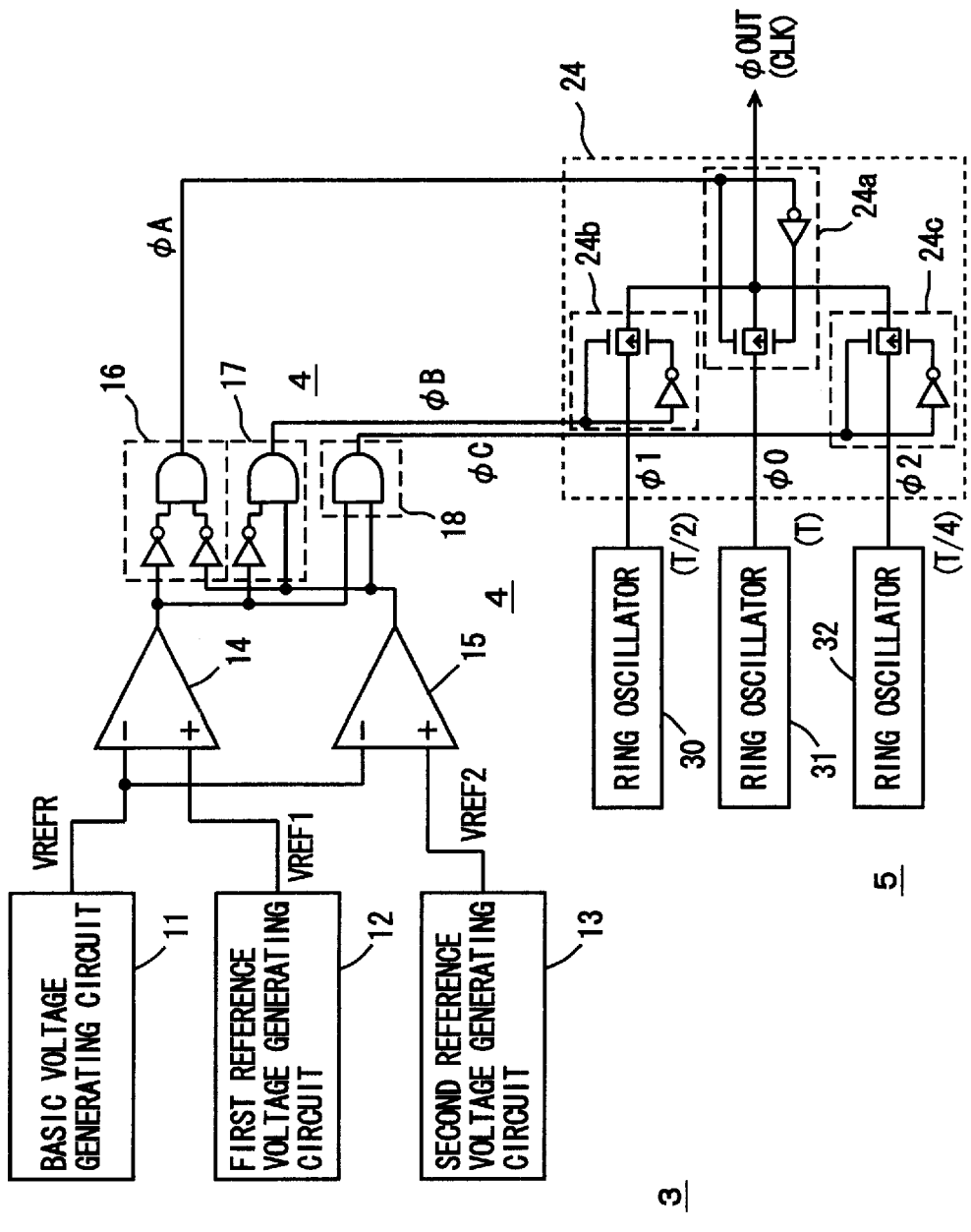
FIG. 8 is a diagram representing a configuration of a clock generator with a temperature compensating function according to a second embodiment of the present invention.

FIG. 8 is a diagram representing a configuration of a clock generator with a temperature compensating function 3 according to a second embodiment of the present invention. The clock generator with a temperature compensating function 3 shown in FIG. 8 is different from the clock generator with a temperature compensating function according to the first embodiment shown in FIG. 3, in the following points: ring oscillators 30 and 32 are used instead of the frequency dividing circuits 22 and 23. An oseillating cycle period of a ring oscillator 31 is T, and the ring oscillators 30 and 32 perform oscillating operations at cycle periods T/2 and T/4, respectively. The construction of the other part is the same as a corresponding part of the configuration shown in FIG. 3 and the same reference numerals are allotted to corresponding components.

In a variable clock generating circuit 5 shown in FIG. 8, one of output signals φ0 to φ2 of the ring oscillators 24, 30 and 32 is selected according to temperature detection signals φA to φC from a temperature detecting circuit 4. Operations of a temperature detecting circuit 4 and a variable clock generating circuit 5 are the same as the operations represented by the signal waveform diagram shown in FIG. 6. A temperature detection signal is generated according to a comparison result of the basic voltage VREFR with the reference voltages VREF1 and VREF2, and a cycle period of the output clock signal φOUT is changed responsively.

The ring oscillators 24, 30 and 32 are used to generate oscillating signals having respective cycle periods different from each other and oscillating cycle period is switched according to the operating temperature. Thus, the output clock signal φOUT (clock signal CLK) can be correctly generated without any influence of an operating characteristic of a frequency dividing circuit.

Note that in the configuration of FIG. 8, oscillating periods of the ring oscillators 24, 30 and 32 are set to T, T/2 and T/4, respectively. The oscillating cycle periods of the ring oscillators 24, 30 and 32, however, have only to be determined to appropriate values according to respective temperature dependencies of the ring oscillators 24, 30 and 32.

Furthermore, by providing ring oscillators having n kinds of oscillating cycle period periods different from each other and by selecting a signal outputted from one ring oscillator according to an n-bit temperature detection signal, a cycle of the output clock signal φOUT can be adjusted according to a finer temperature region to compensate for a temperature dependency, thereby allowing generation of the output clock φOUT having a constant oscillating cycle period.

Third Embodiment

Figure 9:
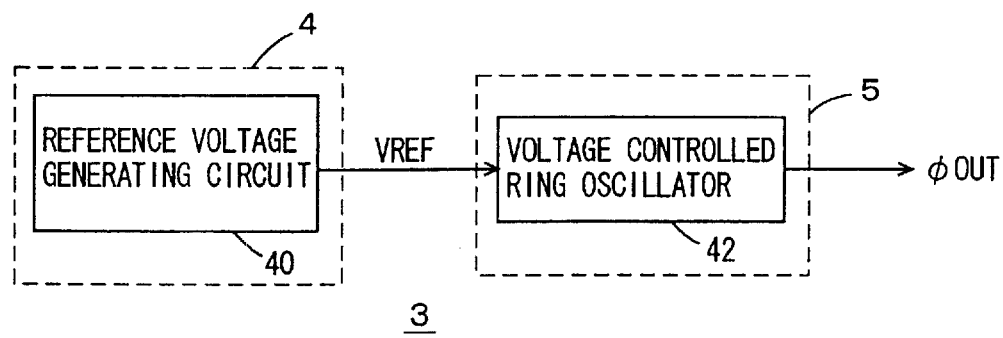
FIG. 9 is a diagram schematically showing a configuration of a clock generator with a temperature compensating function according to a third embodiment of the present invention.
Figure 10:
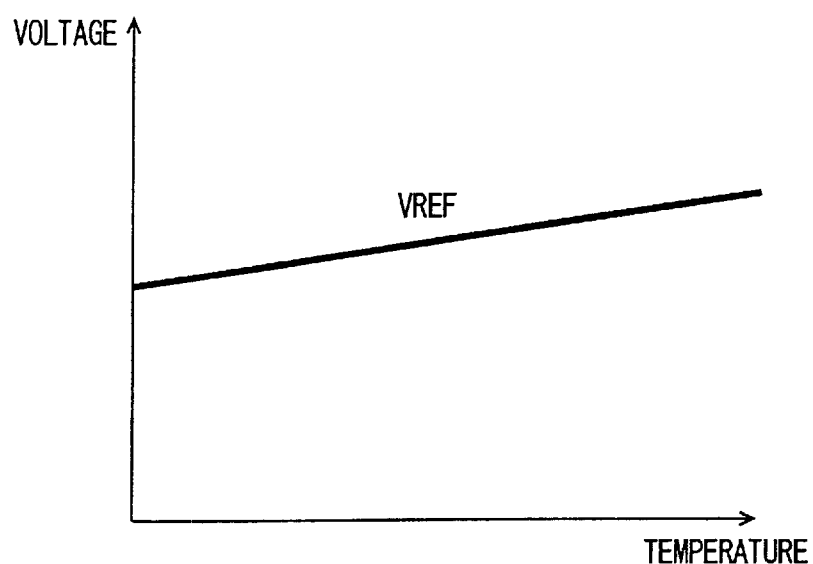
FIG. 10 is a graph representing a temperature dependency of a reference voltage shown in FIG. 9.

FIG. 9 is a diagram schematically showing a configuration of a clock generator with a temperature compensating function 3 according to a third embodiment of the present invention. In FIG. 9, a temperature detecting circuit 4 includes a reference voltage generating circuit 40 for generating the reference voltage VREF having a temperature dependency. A configuration of the reference voltage generating circuit 40 is the same as the configuration shown in FIG. 7 and the reference voltage VREF having a positive temperature coefficient is generated as shown in FIG. 10.

A variable clock generating circuit 5 is constituted of a voltage controlled ring oscillator 42 whose oscillating cycle period is changed by the reference voltage VREF. The voltage controlled ring oscillator 42 receives the reference voltage VREF as a control voltage and the oscillating cycle period thereof becomes shorter as a voltage level of the reference voltage VREF rises. That is, as shown in FIG. 11, as temperature increases, an oscillating cycle period of the voltage controlled ring oscillator 42 becomes shorter.

Figure 11:
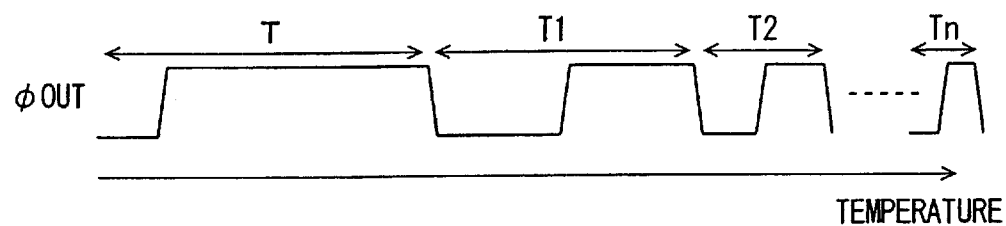
FIG. 11 is a signal waveform diagram representing an operation of a voltage controlled ring oscillator shown in FIG. 9.

In FIG. 11, an oscillating cycle period of the output clock signal φOUT of the voltage controlled ring oscillator 42 is shown changing among cycle periods T, T1, T2, . . . , and Tn in a discrete manner. However, a level of the reference voltage VREF from the reference voltage generating circuit 40 changes continuously according to the temperature as shown in FIG. 10, and an oscillating cycle period of the voltage controlled ring oscillator 42 also changes continuously according to a level of the reference voltage VREF. Thereby, the oscillating cycle period can be changed in the analog fashion according to the temperature, and a more correctly temperature compensated output clock φOUT can be generated.

Figure 12:
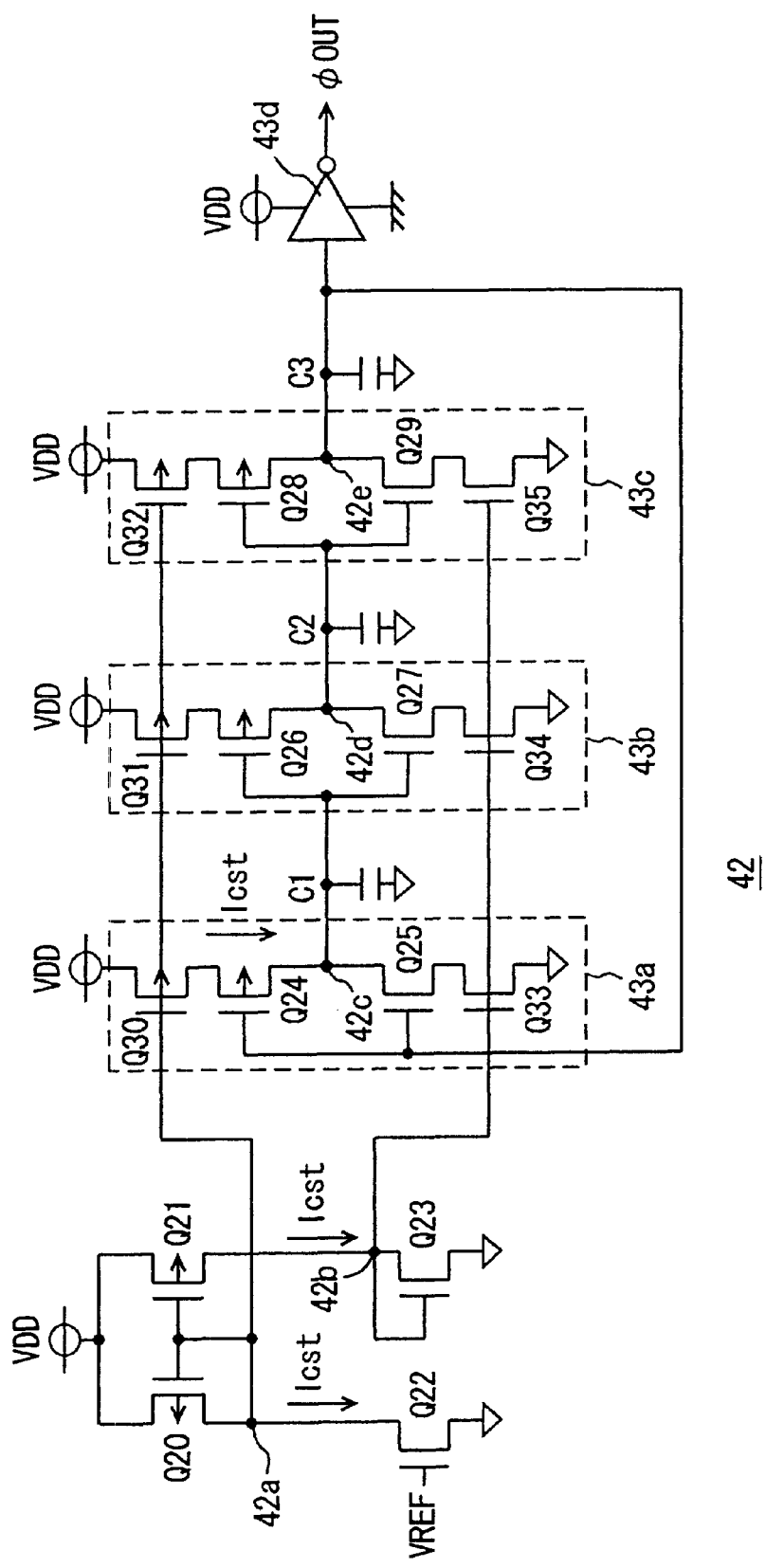
FIG. 12 is a diagram representing an example of the configuration of the voltage controlled ring oscillator shown in FIG. 9.

FIG. 12 is a diagram representing an example configuration of the voltage controlled ring oscillator 42 shown in FIG. 9. In FIG. 12, the voltage controlled ring oscillator 42 includes: a reference current generating circuit for generating a reference current Icst dependent on the reference voltage VREF; and a ring oscillator having an operating current thereof set according to the reference current generated by the reference current generating circuit.

The reference current generating circuit includes: a P channel MOS transistor Q20, connected between a power supply node and a node 42a, having a gate connected to the node 42a; an N channel MOS transistor Q22 connected between the node 42a and a ground node, and receiving the reference voltage VREF at its gate; a P channel MOS transistor Q21, connected between the power source and a node 42b, having a gate connected to the node 42a; and an N channel MOS transistor Q23, connected between the node 42b and the ground node, having a gate connected to the node 42b.

In the reference current generating circuit, the MOS transistors Q20 and Q21 constitute a current mirror circuit. The MOS transistors Q20 and Q21 are set to have the same size as each other and currents Icst of the same amount flow through the MOS transistors Q20 and Q21. The MOS transistor Q20 supplies the reference current Icst to the MOS transistor Q22. The reference current Icst is a drain current of the MOS transistor Q22 and an amount of the reference current Icst is set by the reference voltage VREF.

The MOS transistor Q23 has the gate and drain thereof connected together to the node 42b and converts the reference current Icst supplied from the MOS transistor Q21 to a voltage.

The ring oscillator includes cascaded CMOS inverter circuits 43a to 43c of three stages. An output signal of the inverter circuit 43c is fed back to the input of the inverter 43a at the first stage. An inverter 43d inverts an output signal of the inverter circuit 43c of the last stage, to generate the output signal φOUT.

The CMOS inverter circuit 43a includes: P channel MOS transistors Q30 and Q24 connected in series between the power supply and an output node 42c; and N channel MOS transistors Q25 and Q33 connected in series between the output node 42c and the ground node. The CMOS inverter circuit 43b includes: P channel MOS transistors Q31 and Q26 connected in series between the power supply and an output node 42d; and N channel MOS transistors Q27 and Q34 connected in series between the output node 42d and the ground node. The CMOS inverter circuit 43c includes: P channel MOS transistors Q32 and Q28 connected in series between the power supply and an output node 42e; and N channel MOS transistors Q29 and Q35 connected in series between the output node 42e and the ground node.

The gates of the MOS transistors Q30 to Q32 are connected to the node 42a of the reference current generating circuit, and the gates of the MOS transistors Q33 to Q35 are connected to the node 42b of the reference current generating circuit. The MOS transistors Q30 to Q32 and the P channel MOS transistors Q20 constitute a current mirror circuit and the MOS transistors Q33 to Q35 and the N channel MOS transistors Q23 constitute a current mirror circuit. Therefore, operating currents of the CMOS inverter circuits 43a to 43c are determined by the MOS transistors Q30 to Q32 and Q33 to Q35, serving as current sources. When sizes of the MOS transistors Q30 to Q32 are the same as those of the MOS transistor Q20 and sizes of the MOS transistors Q33 to Q35 are the same as those of the MOS transistor Q23, a current of the same amount as that of the reference current Isct flows in each of the CMOS inverter circuits 43a to 43c.

Delay capacitors C1 to C3 are connected to the output nodes of 42c to 42e of the respective CMOS inverter circuits 43a to 43c. An oscillating cycle period of the ring oscillator constructed of the CMOS inverter circuits 43a to 43c is determined by the speeds of charging and discharging the capacitors C1 to C3.

The inverter 43d receives the power supply voltage VDD at its operating power supply node and an operating current thereof does not change. The inverter 43d operates as a buffer circuit for driving a comparatively large load.

In the configuration of the voltage controlled ring oscillator 42 shown in FIG. 12, as the reference voltage VREF rises, a value of the reference current Isct increases. With increase in the reference current Isct, the CMOS inverter circuits 43a to 43c receive increased operating current Isct to charge and discharge the respective capacitors C1 to C3 at higher speed, resulting in a reduced oscillating cycle period of the ring oscillator. On the other hand, as the reference voltage VREF lowers, an amount of the reference current Isct decreases. With decreases in the reference current Isct, CMOS inverter circuits 43a to 43c receive the reduced operating current Isct to charge and discharge the respective capacitors C1 to C3 at a slower speed, resulting in an increased oscillating cycle period of the ring oscillator.

Accordingly, as shown in FIG. 12, by using the voltage controlled ring oscillator 42 and setting an operating current of the ring oscillator with the reference voltage VREF having a temperature dependency being a bias voltage, an oscillating cycle period of the ring oscillator can be changed continuously according to the operating temperature to compensate for reduction in operating speed of the CMOS inverter circuits 43a to 43c when the temperature rises, thereby enabling generation of the clock signal φOUT having a exactly constant cycle.

Sizes of the MOS transistors Q20 and Q23 of the reference current generating circuit may not be the same as sizes of the MOS transistors Q30 to Q32, and Q33 and Q35 serving as the current sources of the ring oscillator. The sizes of these transistors have only to be appropriately determined according to a temperature dependency of a cycle period of the output clock signal and a temperature dependency of the reference voltage.

According to the third embodiment of the present invention, as described above, an operating current of a voltage controlled ring oscillator is controlled using the reference voltage having a temperature dependency. Thus, an oscillating cycle period of the ring oscillator can be adjusted continuously according to the operating temperature and accordingly a change in cycle period of the clock signal according to the operating temperature can be compensated for. Consequently, an internal clock signal having a constant cycle period can be stably generated.

Fourth Embodiment

Figure 13:
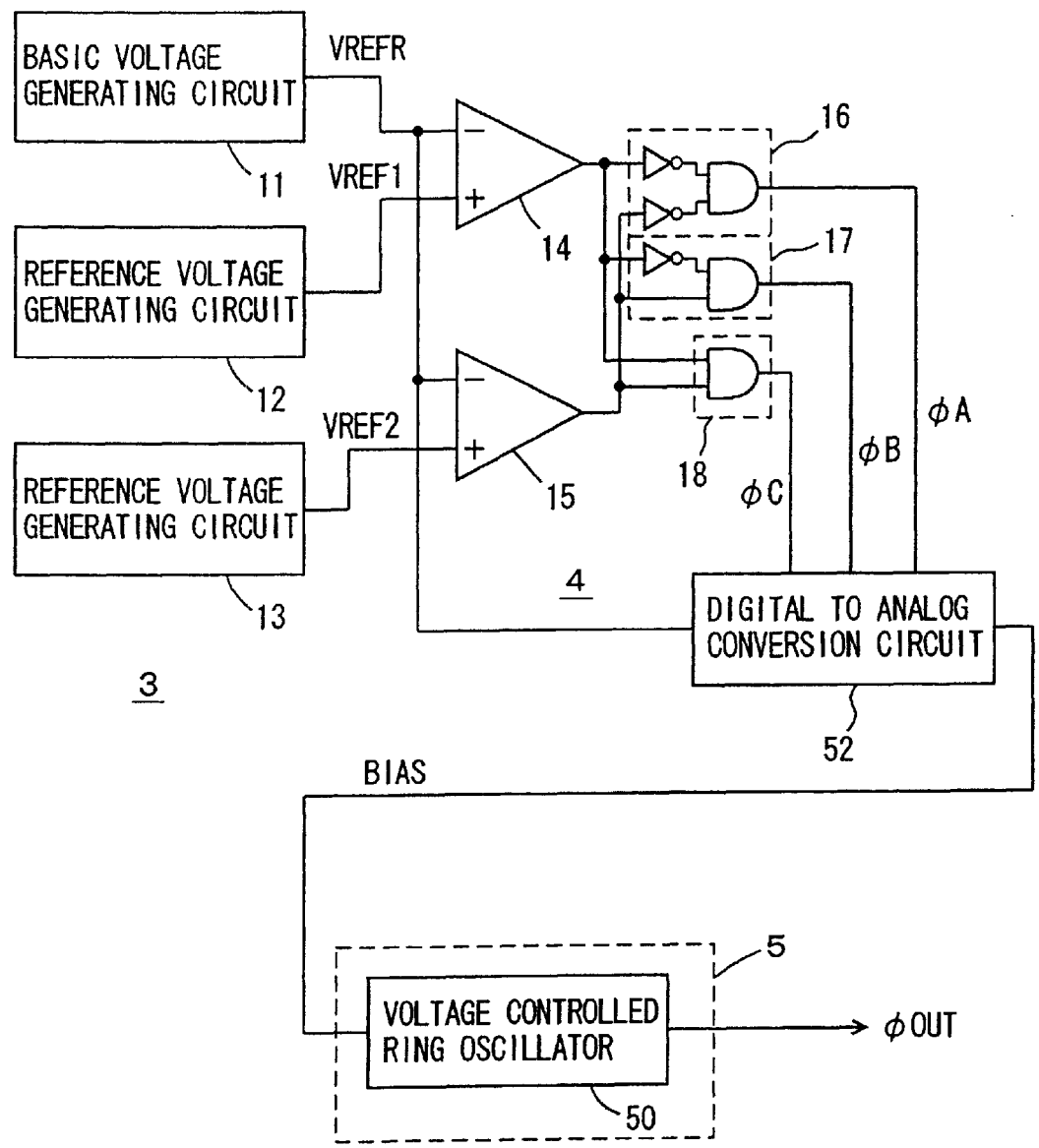
FIG. 13 is a diagram representing a configuration of a clock generator with a temperature compensating function according to a fourth embodiment of the present invention.

FIG. 13 is a diagram representing a configuration of a clock generator with a temperature compensating function 3 according to a fourth embodiment of the present invention. The clock generator with a temperature compensating function 3 shown in FIG. 13 includes a digital to analog converting circuit 52 for converting the temperature detection signals φA to φC to analog signals in a temperature detecting circuit 4. The other part of the configuration of the temperature detecting circuit 4 shown in FIG. 13 is the same as a corresponding part of the configuration of the temperature detecting circuit in the first embodiment shown in FIG. 3. The same reference numerals are attached to corresponding components and detailed descriptions thereof are omitted.

Figure 14:
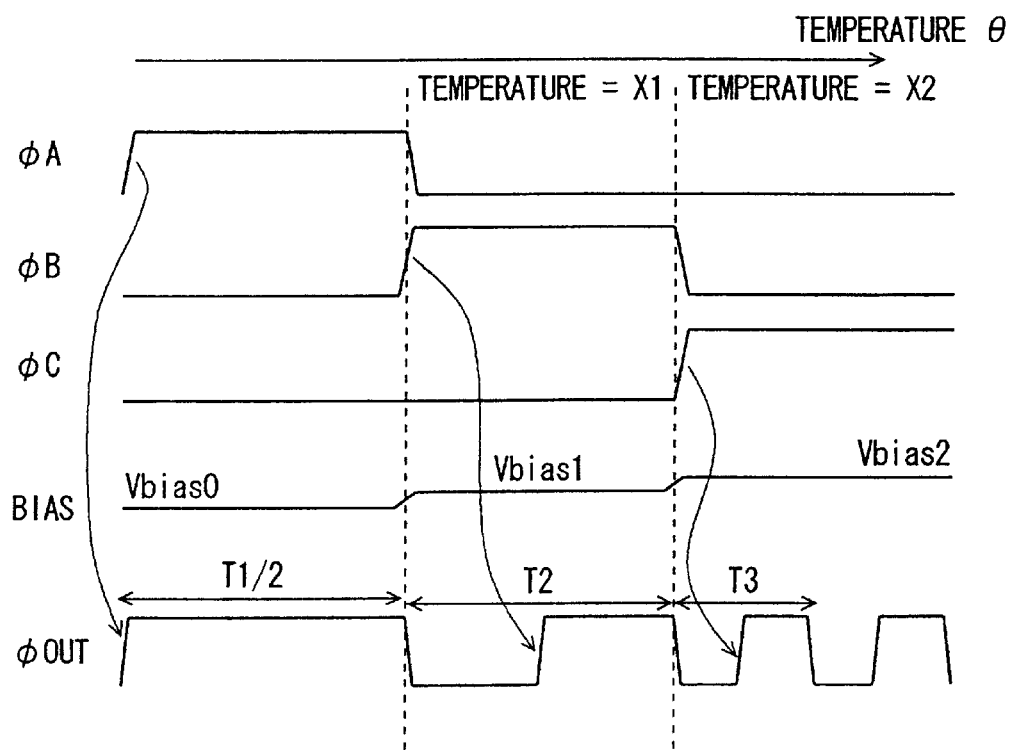
FIG. 14 is a signal waveform diagram representing an operation of the circuit shown in FIG. 13.

A variable clock generator 5 includes: a voltage controlled ring oscillator 50 whose oscillating cycle period is set according to an analog signal (voltage) BIAS from the digital to analog converting circuit 52. The voltage controlled ring oscillator 50 has the same configuration as the voltage controlled ring oscillator 42 shown in FIG. 12 and receives a bias voltage BIAS instead of the reference voltage VREF. Now, description will be given of the clock generator with a temperature compensating function 3 shown in FIG. 13 with reference to a signal waveform diagram shown in FIG. 14.

A relationship between the basic voltage VREFR and each of the reference voltages VREF1 and VREF2 are the same as that in the first embodiment. The reference voltages VREF1 and VREF2 have temperature characteristics of intersecting the basic voltage VREFR at temperatures X1 and X2, respectively.

When the temperature Θ is lower than the temperature X1, the temperature detection signal φA from a gate circuit 16 attains H level and the digital to analog converting circuit 52 generates a voltage Vbias0 as the bias voltage BIAS to apply the voltage Vbias0 to the voltage controlled ring oscillator 50. In this state, the voltage controlled ring oscillator 50 performs an oscillating operation at a cycle period T1, to generate the output clock φOUT.

When the temperature Θ lies between temperatures X1 and X2, the temperature detection signal φB from a gate circuit 17 is activated and the bias voltage BIAS from the digital to analog conversion circuit 52 raises its voltage level to a voltage Vbias1. In response, the voltage controlled ring oscillator 50 performs an oscillating operation at a cycle period T2, to generate the output clock φOUT.

When the temperature Θ becomes equal to or higher than the temperature X2, the temperature detection signal φC from a gate circuit 18 is activated and the bias voltage BIAS from the digital to analog conversion circuit 52 rises to a voltage level of a voltage Vbias2. In response, the voltage controlled ring oscillator 50 comes to have an oscillating cycle period T3 and performs oscillating operation at a shorter cycle period to generate the output clock φOUT.

Even when multi-bit temperature detection signals φA to φC are generated, the digital to analog conversion circuit 52 converts the multi-bit temperature detection signals φA to φC to analog signals (voltages) by to generate the bias voltage BIAS. Thus, an oscillating cycle period of the voltage controlled ring oscillator 50 can be changed according to the operating temperature to reduce the oscillating cycle period with rise in temperature, to compensate for increase in oscillating cycle period otherwise occurring with the rise in temperature, such that an actual cycle period of the internal clock signal CLK can be kept constant.

Figure 15:
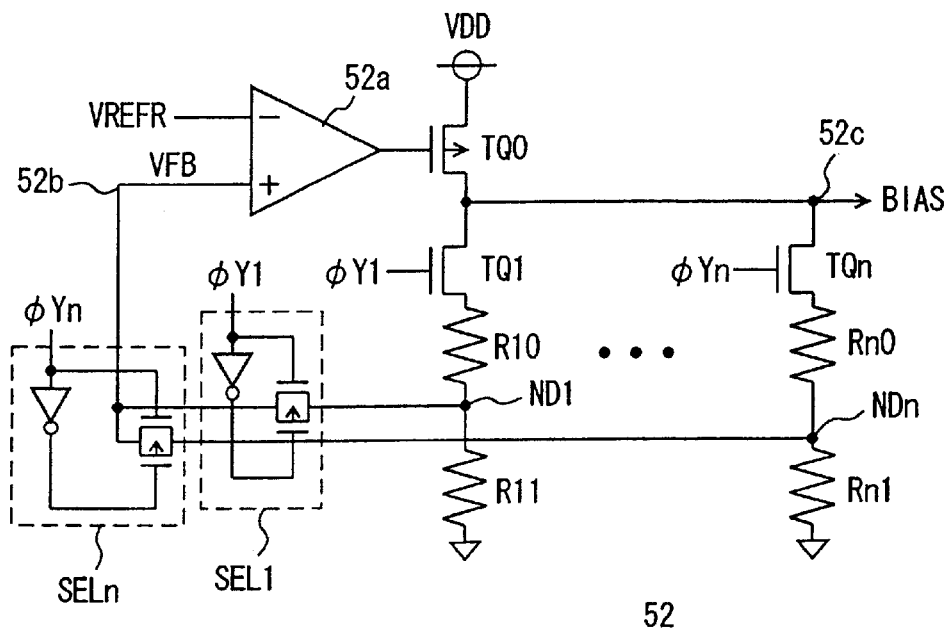
FIG. 15 is a diagram representing an example of the configuration of a digital to analog conversion circuit shown in FIG. 13.

FIG. 15 is a diagram representing an example of the configuration of the digital to analog conversion circuit 52 shown in FIG. 13. In FIG. 15, there is shown a configuration of a circuit for generating the bias voltage BIAS according to n bit temperature detection signals φY1 to φYn. The temperature detection signals φY1 to φYn correspond to the temperature detection signal φA to φC shown in FIG. 13.

In FIG. 15, the digital to analog conversion circuit 52 includes: a comparing circuit 52a for comparing the basic voltage VREFR with a feed back voltage VFB on a node 52b; a P channel MOS transistor TQ0 supplying a current from a power supply node to a node 52c according to an output signal of the comparing circuit 52a; N channel MOS transistors TQ1 to TQn connected in parallel to the node 52c, and receiving the temperature detection signals φY1 to φYn at the respective gates; and level shifting circuits provided corresponding to the respective MOS transistors TQ1 to TQn.

The level shifting circuits each includes a pair of resistance elements Ri0 and Ri1 (i=1−n) connected in series between a corresponding MOS transistor TQi and the ground node. The voltage BIAS on the node 52c is divided by the resistance elements Ri0 and Ri1 connected in series, and a level shifted voltage is generated on a corresponding voltage output node NDi(i=1−n).

The digital to analog conversion circuit 52 further includes: selectors SEL1 to SELn provided corresponding to the respective voltage output nodes ND1 to NDn, rendered conductive, when the respective temperature detection signals φY1 to φYn are activated, for coupling corresponding voltage nodes to the node 52b. The selectors SEL1 to SELn each include an inverter for inverting a corresponding temperature detection signal φY1 (i=1−n) to generate a complementary temperature detection signal; and a CMOS transmission gate rendered conductive according to complementary temperature detection signals.

In the digital to analog conversion circuit 52, when the feed back voltage VFB is lower than the basic voltage VREFR, the comparing circuit 52a outputs a low level signal to increase a conductance of the MOS transistor TQ0 that supplies a current from the power supply node to the node 52c to raise a voltage level of the bias voltage BIAS. On the other hand, when the feed back voltage VFB is higher than the basic voltage VREFR, the comparing circuit 52a outputs a H level signal to set the MOS transistor TQ0 into an off state. Accordingly, the comparing circuit 52a adjusts a voltage level of the bias voltage BIAS such that the basic voltage VREFR and the feed back voltage VFB are equal to each other. The feed back voltage VFB is given by the following expression:

VFB=BIAS·Ri1/(Ri0+Ri1)=VREFR.

Therefore, the bias voltage BIAS is given by the following expression:

BIAS={1+(Ri0/Ri1)}·VREFR.

By selectively turning on the MOS transistors TQ1 to TQn according to the temperature detection signals φY1 to φYn such that a resistance ratio between the selected level-shifting resistance elements Ri0 and Ri, Ri0/Ri1 increases with rise in temperature, a voltage level of the bias voltage BIAS can be sequentially raised with the temperature rise. An oscillating cycle period of the voltage controlled ring oscillator 50 can be reliably decreased with the temperature rise.

According to the fourth embodiment of the present invention, as described above, a multi-bit temperature change detection signal is converted into an analog signal, and an oscillating cycle period of a clock signal can be adjusted according to the temperature, to generate a temperature compensated clock signal having an exact cycle period with a simple circuit configuration.

Fifth Embodiment

Figure 16:
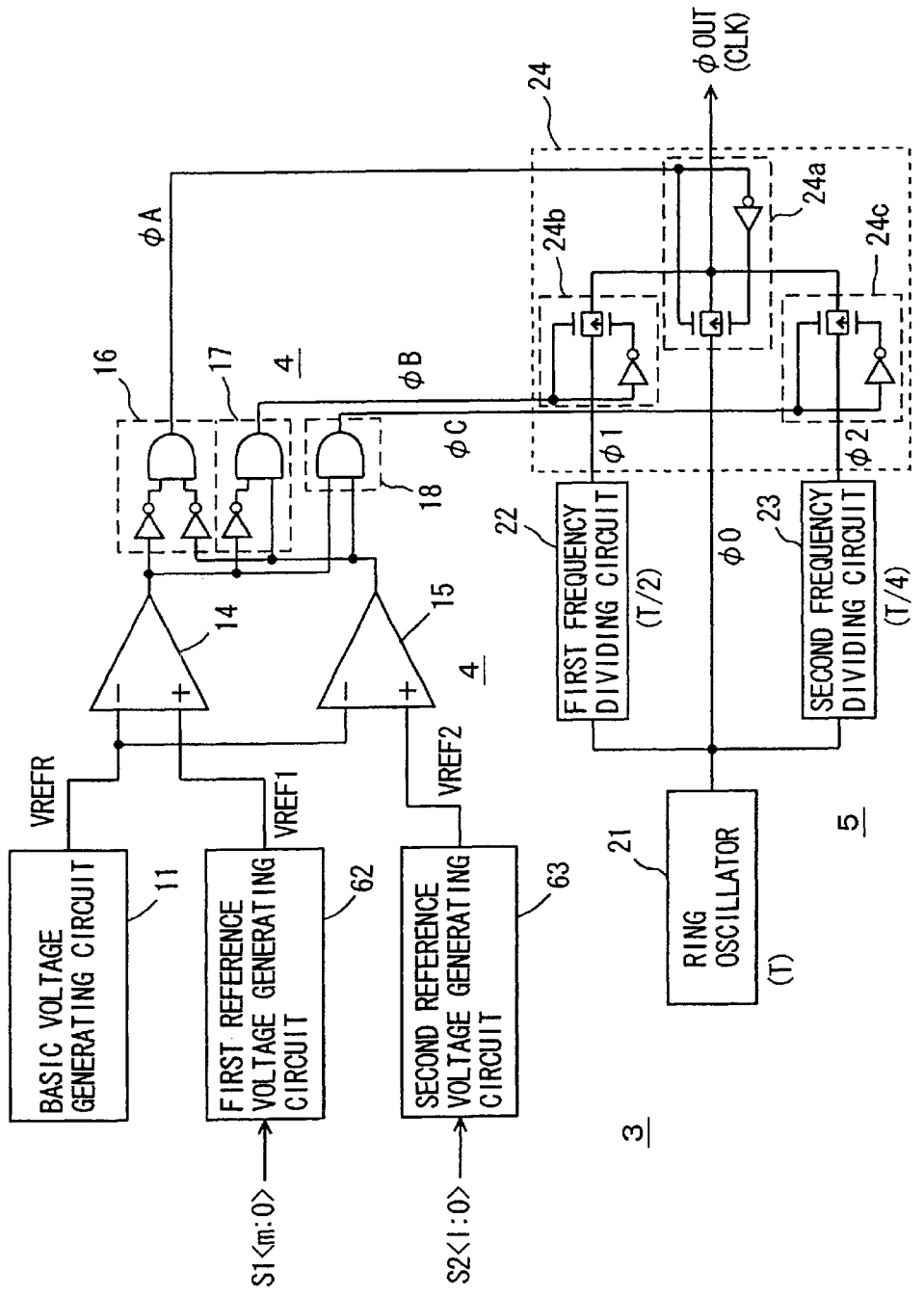
FIG. 16 is a diagram schematically showing a configuration of a clock generator with a temperature compensating function according to a fifth embodiment of the present invention.

FIG. 16 is a diagram schematically showing a configuration of a clock generator with a temperature compensating function 3 according to a fifth embodiment of the present invention. The clock generator with a temperature compensating function 3 shown in FIG. 16 is different in configuration from the clock generator with a temperature compensating function 3 in the first embodiment shown in FIG. 3 in the following point. That is, characteristic setting data S1<m:0> and S2<1:0> are applied to a first reference voltage generating circuit 62 and a second reference voltage generating circuit 63. Temperature characteristics and voltage levels of the reference voltages VREF1 and VREF2 are set according to the characteristic setting data S1<m:0> and S2<1:0>. The other part of the configuration of the circuit shown in FIG. 16 is the same as a corresponding part of the configuration shown in FIG. 3, the same reference numerals are attached to corresponding components, and detailed descriptions thereof are omitted.

Figure 17:
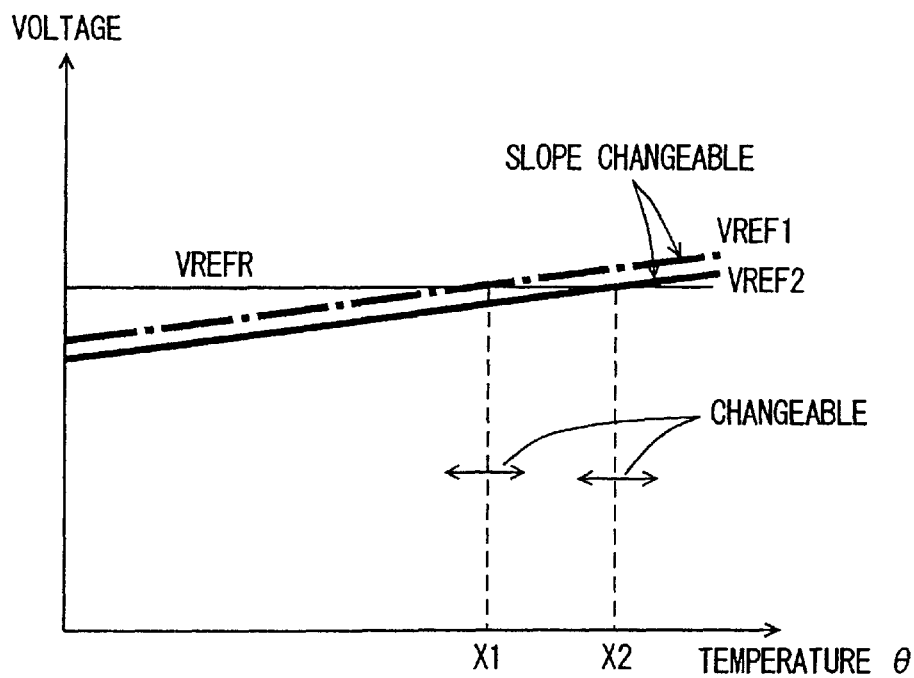
FIG. 17 is a graph schematically showing temperature dependencies of reference voltages and a basic voltage shown in FIG. 16.

In the configuration shown in FIG. 16, temperature characteristics of the reference voltages VREF1 and VREF2 can be changed according to the characteristic setting data S1<m:0> and S2<1:0> as shown in FIG. 17. That is, characteristic line slopes and starting voltage levels of the reference voltages VREF1 and VREF2 can be changed, to alter intersecting temperatures between the basic voltage VREFR and each of the reference voltages VREF1 and VREF2. Therefore, a temperature region within which a frequency/cycle period of the clock signal is varied can be set according to an actual capability of the ring oscillator 21, thereby enabling generation of a stable internal clock signal.

The characteristic setting data S1<m:0> and S2<1:0> may be programmed by fuse blowing or the like in a test step. Alternatively, the data may be set in a register circuit under control of the write/erasure control circuit (the circuit 909 of FIG. 30) included in the memory circuit shown in FIG. 1.

Figure 18:
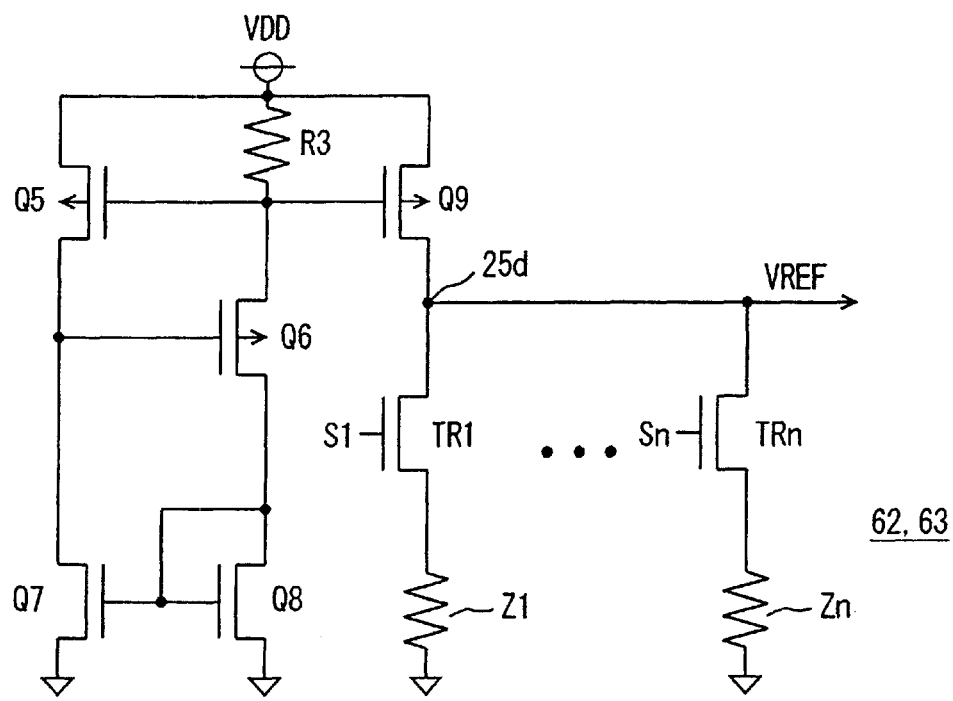
FIG. 18 is a diagram representing an example of the configuration of a reference voltage generating circuit shown in FIG. 16.

FIG. 18 is a diagram representing an example of the configuration of the reference voltage generating circuit 62 or 63 shown in FIG. 16. Configurations of the reference voltage generating circuits 62 and 63 are the same as each other, and therefore, one of them is representatively shown in FIG. 18. The reference voltage generating circuit shown in FIG. 18 is different in configuration from the reference voltage generating circuit shown in FIG. 7 in the following point. That is, N channel MOS transistors TR1 to TRn rendered conductive in response to the characteristic setting data bits S1 to Sn are connected in parallel to the output node 25d and resistance elements Z1 to Zn are connected between the respective MOS transistors TR1 to TRn and the ground node. The configuration of the other part of the circuit shown in FIG. 18 is the same as a corresponding part of the circuit configuration shown in FIG. 7, the same reference numerals are attached to corresponding components, and detailed descriptions thereof are omitted.

In the configuration of the reference voltage generating circuit shown in FIG. 18, the reference voltage VREF is expressed by |Vthp|·Zi/R3, as shown with reference to FIG. 7, where Zi indicates a resistance value of a resistance element Zi (i=1−n).

Therefore, by selectively setting the characteristic setting data bits S1 to Sn to H level, a value of the ratio Zi/R3 can be altered, to change a temperature dependency and a voltage level of the reference voltage VREF. By setting resistance values of the resistance element R3 and Z1 to Zn sufficiently large and by setting channel resistance values of the MOS transistors TR1 to TRn in a conductive state to the extent that a temperature dependency of the channel resistance can be neglected, a temperature dependency can be altered while maintaining a positive temperature characteristic of the reference voltage VREF, thereby enabling a cycle period variable temperature region for the clock signal to change.

In the above configuration, only one bit of the characteristic setting data bits S1 to Sn may be set to H level, or a plurality of bits thereof may be set to H level. In this case, selected resistances are connected in parallel between the output node 25d and the ground node.

First Modification

Figure 19:
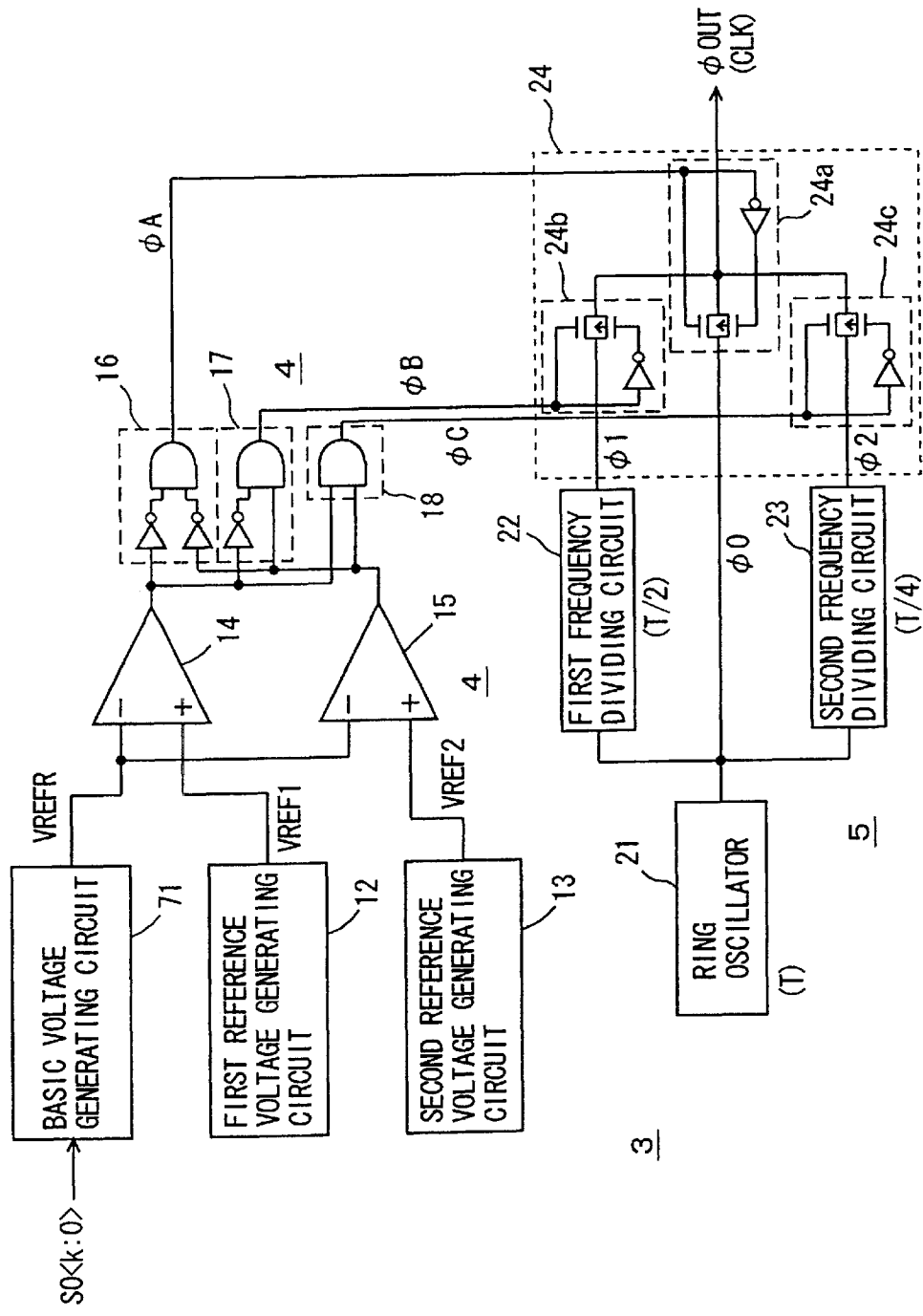
FIG. 19 is a diagram representing a modification of the fifth embodiment of the present invention.

FIG. 19 is a diagram representing a first modification of the fifth embodiment of the present invention. In a clock generator with a temperature compensating function 3 shown in FIG. 19, characteristic setting data S0<k:0> is applied to a basic voltage generating circuit 71 and a temperature dependency and a voltage level of the basic voltage VREFR can be altered. The configuration of the other part is the same as a corresponding part of the configuration of the clock generator with a temperature compensating function 3 shown in FIG. 3, the same reference numerals are attached to corresponding components and detailed descriptions thereof are omitted.

Figure 20:
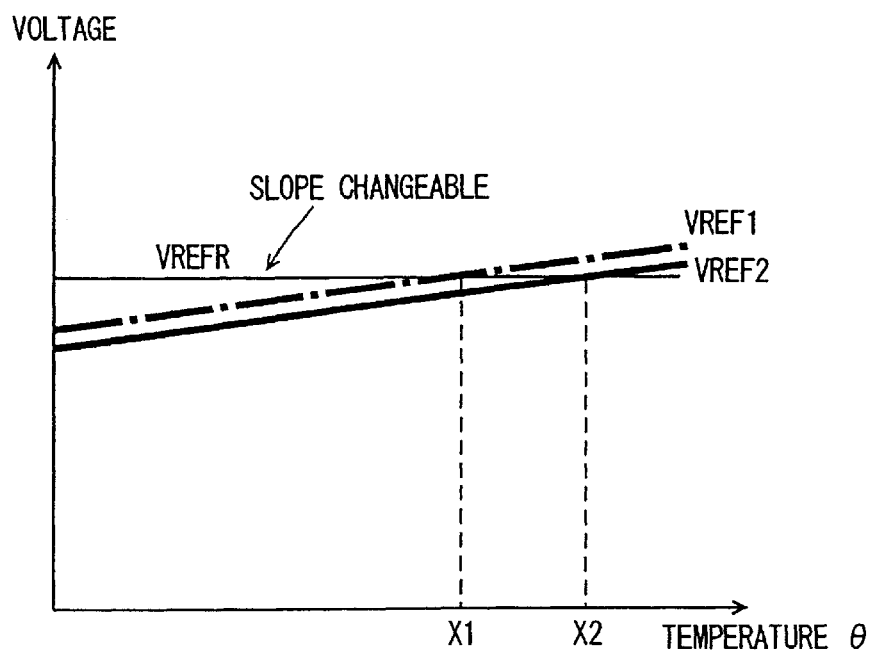
FIG. 20 is a graph schematically showing temperature dependencies of reference voltages and a basic voltage in FIG. 19.

In a configuration of the clock generator with a temperature compensating function 3 shown in FIG. 19, a temperature dependency of the basic voltage VREFR generated by the basic voltage generator 71 can be altered according to the characteristic setting data S0<k:0>. Therefore, as shown in FIG. 20, the basic voltage VREFR is not kept constant against a change in temperature, and can be varied with a change in the temperature Θ, to accordingly change a frequency and a frequency switch temperature of the clock signal. Thereby, in a test, a cycle switch temperature region can be set to an optimal region according to an actual operating speed of the ring oscillator 21 and an oscillating cycle period of the clock signal can be held exactly constant over a wide temperature range.

Figure 21:
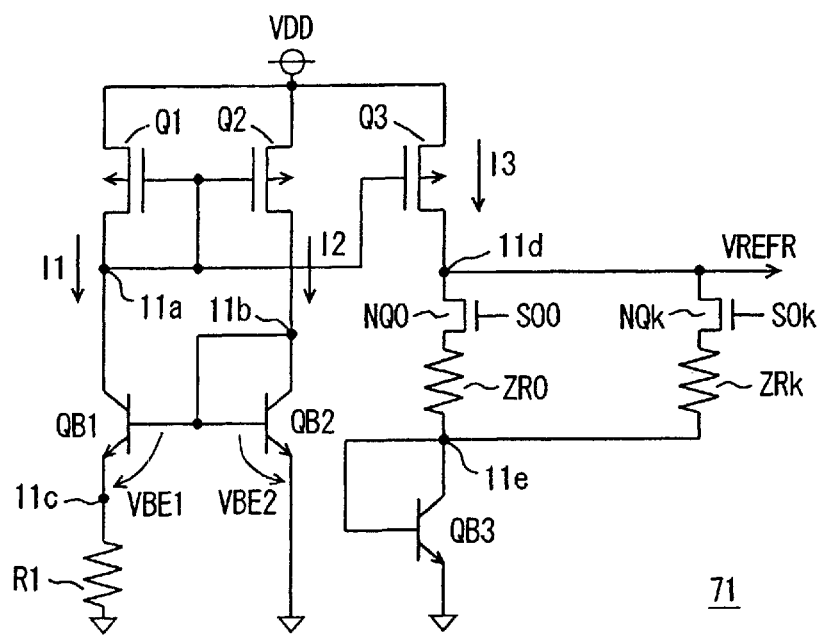
FIG. 21 is a diagram representing an example configuration of a basic voltage generating circuit shown in FIG. 19.

FIG. 21 is a diagram representing an example of the configuration of the basic voltage generating circuit 71 shown in FIG. 19. In FIG. 21, the basic voltage generating circuit 71 includes: N channel MOS transistors NQ0 to NQk connected in parallel to an output node 11d and receiving characteristic setting data bits S00 to S0k at their respective gates; and resistance elements ZR0 to ZRk connected between the respective MOS transistors NQ0 to NQk and a node 11e. The configuration of the other part is the same as a corresponding part of the basic voltage generating circuit 11 shown in FIG. 6, the same reference numeral are attached to corresponding components and detailed descriptions thereof are omitted.

The basic voltage VREFR is represented by the following expression:

$$VREFR = Vt \cdot \ln(N) \cdot (Zri/R1) + VBE3,$$

where ZRi indicates a resistance value of a resistance element connected between the nodes 11d and 11e. A plurality of bits of the characteristic setting data bits S00 to S0k may be simultaneously set to H level.

By selectively setting the characteristic setting data bits S00 to S0k to H level, a ratio of resistance value between resistance elements, (ZRi/R1) can be changed, and a voltage level and a temperature dependency of the basic voltage VREFR can be changed. Particularly, a bandgap voltage VBE3 of the NPN bipolar transistor QB3 has a negative temperature dependency and the coefficient Vt has a positive temperature coefficient. Therefore, a temperature dependency of the basic voltage VREFR can be set to a positive or negative value by changing the resistance ratio (ZRi/R1), and a cycle switch temperature can be set to an optimal value in a wide temperature range.

The characteristic setting data S0<k:0> may be stored in a register circuit or the like, or may be set by programming of fuse elements, for example, on the basis of a test result, so as to set an optimal temperature region under control of the write/read control circuit included in the memory circuit shown in FIG. 1.

Second Modification

Figure 22:
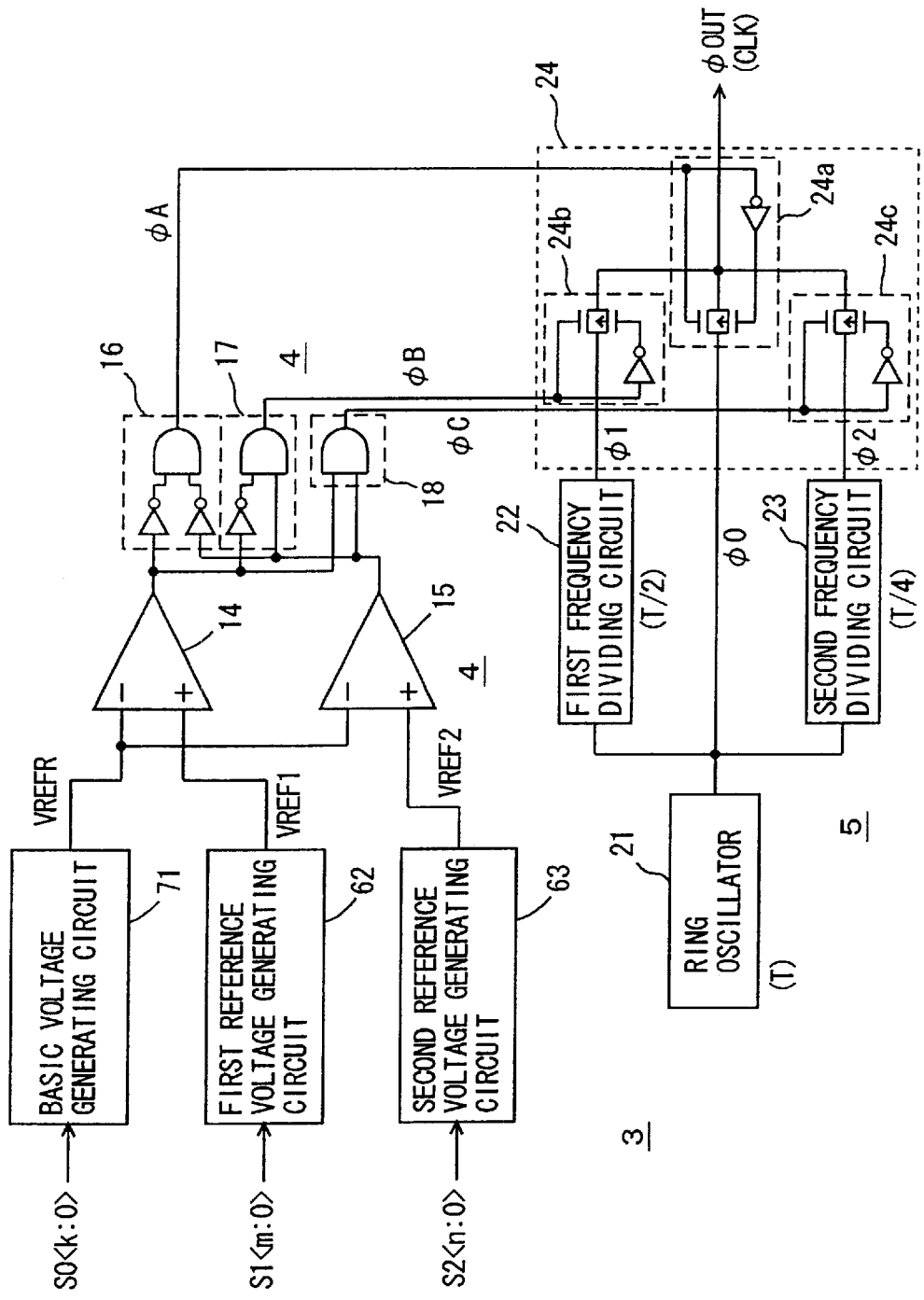
FIG. 22 is a diagram representing a configuration of a second example modification of the fifth embodiment of the present invention.

FIG. 22 is a diagram representing a configuration of a clock generating circuit with a temperature compensating function 3 of a second modification of the fifth embodiment of the present invention. In the clock generator with a temperature compensating function 3 shown in FIG. 22, the basic voltage generating circuit 71 can alter a temperature dependency and a voltage level of the basic voltage VREFR according to the characteristic setting data S0<k:> and the first and second reference voltage generating circuits 62 and 63 can alter voltage levels and temperature dependencies of the respective reference voltages VREF 1 and VREF2 according to characteristic setting data Si<m:0> and S2<n:0>. The configuration of the other part of the circuit shown in FIG. 22 is the same as corresponding part of the clock generator with a temperature compensating function 3 shown in FIG. 3, the same reference numerals are attached to corresponding components, and detailed descriptions thereof are omitted.

The clock generator with a temperature compensating function 3 shown in FIG. 22 is a combination of the configurations of the preceding two embodiments in the fifth embodiment. A clock frequency switch temperature can be altered with flexibility by changing temperature dependencies and voltage levels of the basic voltage VREFR, and the reference voltages VREF1 and VREF2. Therefore, even in a case where a small number of available resistance elements for changing temperature dependency and voltage level in the first and second reference voltage generating circuits 62 and 63 is small, a temperature for switching a cycle period of the clock signal can be altered over a wider range by changing a temperature dependency and a voltage level of the basic voltage VREFR, thereby enabling setting of an optimal cycle switch temperature for the clock signal according to a characteristic of the ring oscillator 21.

The configuration in the fifth embodiment for changing temperature dependencies and voltage levels of the reference voltages and/or the basic voltage may be used in combination with any of the configurations of the second to fourth embodiments.

Other Embodiments

In the above descriptions, there is discussed a clock generator for generating a master clock signal for use in determination of a voltage or an internal timing for write/erasure in a non-volatile memory. However, for example, in a dynamic random access memory (DRAM), a plurality of voltages, such as a high voltage transmitted onto a selected word line, a negative substrate bias voltage applied to a memory cell array substrate region and other voltages are internally generated through a charge pump operation. Therefore, the present invention can also be applied to a circuit generating a clock signal for performing such a charge pump operation in DRAM or other memory devices, provided that the memory device internally generates an internal voltage through charge pump operation using an internally generated clock signal.

As discussed in the foregoing, according to the present invention, the oscillating cycle period of a clock generating circuit for generating an internal clock signal is adapted to varied according to an operating temperature. Thus, a clock signal of a constant cycle period can be produced over a wide temperature range stably, to stabilize the operation of internal circuitry.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
a non-volatile memory circuit for storing data;
clock generating circuitry for generating a clock signal used by said non-volatile memory circuit;
a temperature detecting circuit for detecting an operation temperature, said temperature detecting circuit producing a temperature detection output signal representing a detected operation temperature; and
cycle change circuitry for changing a cycle period of the clock signal generated by said clock generating circuitry according to the temperature detection output signal; and
voltage generating circuitry for generating a voltage required for rewriting storage data of the non-volatile memory circuit in accordance with the clock signal generated from said clock generating circuitry.

2. The semiconductor integrated circuit device according to claim 1, wherein said temperature detecting circuitry is integrated together with said clock generating circuitry and said memory circuit on a common semiconductor chip.

3. The semiconductor integrated circuit device according to claim 1, wherein said temperature detecting circuitry comprises:
a basic voltage generating circuit for generating a basic voltage serving as a comparison basis;
a reference voltage generating circuit for generating a plurality of reference voltages different in temperature dependency from each other;
a comparing circuit for comparing said basic voltage with each of said plurality of reference voltages; and
a temperature determination circuit for generating the temperature detection output signal according to a comparison result signal indicating a result of comparison of said comparing circuit.

4. The semiconductor integrated circuit device according to claim 3, wherein said reference voltage generating circuit comprises:
a constant current generating circuit for generating a constant current; and
a voltage converting circuit for converting the constant current generated by said constant current generating circuit to a voltage to generate a reference voltage of said plurality of reference voltages, said voltage converting circuit being capable of shifting the reference voltage level to be generated.

5. The semiconductor integrated circuit device according to claim 3, wherein said basic voltage generating circuit comprises a changing circuit for changing at least one of a temperature dependency and a voltage level of said basic voltage.

6. The semiconductor integrated circuit device according to claim 5, wherein said changing circuit comprises:
a plurality of resistance elements connection in parallel to each other, and having respective resistance values different from each other; and a select circuit for connecting a selected resistance element in said plurality of resistance elements between an output node and a ground node in response to a select signal, a level of a voltage generated on said output node being set by said selected resistance element connected between the output node and the ground node.

7. The semiconductor integrated circuit device according to claim 3, wherein said reference voltage generating circuit comprises a changing circuit for changing at least one of a temperature dependency and a voltage level of the reference voltages.

8. The semiconductor integrated circuit device according to claim 7, wherein said changing circuit comprises:

a plurality of resistance elements connected in parallel to each other and having resistance values different from each other; and a select circuit for connecting a selected resistance element of said plurality of resistance elements between an output node and a ground node in response to a select signal, a level of a voltage generated on said output node being set by said selected resistance element connected between the output node and the ground node.

9. The semiconductor integrated circuit device according to claim 3, wherein said basic voltage generating circuit generates a voltage having a constant voltage level independent of temperature as said basic voltage.

10. The semiconductor integrated circuit device according to claim 1, wherein said clock generating circuitry generates a plurality of clock signals different in cycle period from each other, and said cycle change circuitry comprises a clock select circuit for selecting a clock signal of said plurality of clock signals in accordance with said temperature detection output signal.

11. The semiconductor integrated circuit device according to claim 10, wherein said clock generating circuitry comprises:

a master clock generating circuit for generating a master clock signal having a first cycle period; and a plurality of frequency dividing circuits each for frequency dividing said master clock signal with frequency division ratios different from other, and said clock select circuit selects one of output signals of said master clock generating circuit and said plurality of frequency dividing circuits in response to said temperature detection output signal.

12. The semiconductor integrated circuit device according to claim 10, wherein said clock generating circuit comprises a plurality of oscillating circuits generating clock signals different in cycle period from each other, and said clock select circuit selects one of output signals of said plurality of oscillating circuits in response to said temperature detection output signal.

13. A semiconductor integrated circuit device comprising:

a memory circuit for storing data;

temperature detecting circuitry, integrated together with said memory circuit on a common semiconductor substrate, for detecting an operating temperature; and clock generating circuitry, integrated together with said memory circuit on the common semiconductor substrate, for generating a clock signal having a cycle period changed according to an output signal of said temperature detecting circuitry, said clock signal being used in said memory circuit, wherein said temperature detecting circuitry comprises a circuit for generating a reference voltage having a voltage level dependent on the operating temperature, and said clock generating circuitry comprises a voltage controlled oscillating circuit having an oscillating cycle period set according to said reference voltage.

14. The semiconductor integrated circuit device according to claim 13, wherein said temperature detecting circuitry comprises:

a basic voltage generating circuit for generating a basic voltage serving as a comparison basis;

a reference voltage generating circuit for generating a plurality of reference voltages different in temperature dependency from each other;

a temperature judging circuit for generating a multi-bit temperature detection signal according to a comparison result of said basic voltage with each of said plurality of reference voltages; and a digital to analog conversion circuit for converting said multi-bit temperature detection signal to an analog signal, and said clock generating circuitry comprises a voltage controlled oscillating circuit having an oscillating cycle period set according to said analog signal.

15. The semiconductor integrated circuit device according to claim 13, wherein said temperature detecting circuitry comprises:

a basic voltage generating circuit for generating a basic voltage;

a reference voltage generating circuit for generating a plurality of reference voltages each having a temperature dependency;

a bias voltage generating circuit for supplying a current to a bias node according to a difference between said basic voltage and a feed back voltage to generate a bias voltage on the bias node;

a temperature determination circuit for comparing said basic voltage with each of said plurality of reference voltages to generate a select signal according to a comparison result; and a feed back circuit for generating said feed back voltage through level shifting of the bias voltage on said bias node, said feed back circuit having an amount of the level shifting determined in response to said select signal, and said clock generating circuitry comprises a voltage controlled oscillating circuit having an oscillating cycle period set by said bias voltage.

16. A semiconductor integrated circuit device comprising:

a memory circuit for storing data;

clock generating circuitry for generating a clock signal used by said memory circuit;

temperature detecting circuit for detecting an operation temperature, the temperature detecting circuit including a voltage generating circuit that generates at least one of a basic voltage or a reference voltage;

cycle change circuitry for changing a cycle period of a clock signal generated by said clock generating circuitry according to a temperature detection output signal of said temperature detecting circuitry representing a result of detection.

* * * * *